US012610674B2

(12) United States Patent
Kim et al.

(10) Patent No.: US 12,610,674 B2
(45) Date of Patent: Apr. 21, 2026

(54) DEEP ULTRAVIOLET LIGHT-EMITTING DIODE

(71) Applicant: SEOUL VIOSYS CO., LTD., Gyeonggi-do (KR)

(72) Inventors: Tae Gyun Kim, Gyeonggi-do (KR); June Sik Kwak, Gyeonggi-do (KR); Kyu Ho Lee, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 427 days.

(21) Appl. No.: 18/097,313

(22) Filed: Jan. 16, 2023

(65) Prior Publication Data

US 2023/0155096 A1 May 18, 2023

Related U.S. Application Data

(63) Continuation of application No. PCT/KR2021/009184, filed on Jul. 16, 2021.

(30) Foreign Application Priority Data

Jul. 17, 2020 (KR) ......................... 10-2020-0088594
Jul. 15, 2021 (KR) ......................... 10-2021-0092721

(51) Int. Cl.
*H10H 20/857* (2025.01)
*H10H 20/825* (2025.01)
*H10H 20/831* (2025.01)

(52) U.S. Cl.
CPC ........ *H10H 20/857* (2025.01); *H10H 20/825* (2025.01); *H10H 20/8312* (2025.01)

(58) Field of Classification Search
CPC ............... H10H 20/857; H10H 20/825; H10H 20/8312; H10H 20/032; H10H 20/819;
(Continued)

(56) References Cited

U.S. PATENT DOCUMENTS 10,622,518 B1 * 4/2020 Zhang ................... H10H 20/825
11,139,338 B2 * 10/2021 Jang ...................... H10H 20/856
(Continued)

FOREIGN PATENT DOCUMENTS

CN 111312871 A * 6/2020 ........... H10H 20/831
JP 2015070079 A 4/2015
(Continued)

OTHER PUBLICATIONS

Extended European Search Report for European Patent Application No. 21843385.2, Jul. 5, 2024, 6 pages.
(Continued)

*Primary Examiner* — Scott B Geyer
(74) *Attorney, Agent, or Firm* — LaBatt, LLC

(57) ABSTRACT

A deep ultraviolet light-emitting diode is provided. A deep ultraviolet light-emitting diode according to one embodiment comprises: a substrate; an n-type semiconductor layer positioned on the substrate; a mesa which is disposed on the n-type semiconductor layer, comprises an active layer and a p-type semiconductor layer, and has a plurality of via-holes exposing the n-type semiconductor layer; n-ohmic contact layers contacting the n-type semiconductor layer in the via-holes; a p-ohmic contact layer contacting the p-type semiconductor layer; an n-pad metal layer electrically connected to the n-ohmic contact layers; a p-pad metal layer electrically connected to the p-ohmic contact layer; an n-bump electrically connected to the n-pad metal layer; and a p-bump electrically connected to the p-pad metal layer, wherein the p-pad metal layer is formed so as to surround the n-pad metal layer.

9 Claims, 30 Drawing Sheets

(58) Field of Classification Search

CPC ... H10H 20/84; H10H 20/835; H10H 20/8316

See application file for complete search history.

(56) References Cited

U.S. PATENT DOCUMENTS

| | | | | |
|---|---|---|---|---|
| 2005/0258444 A1* | 11/2005 | Windisch | H10H 20/8316 | |
| | | | | 438/27 |
| 2006/0043384 A1 | 3/2006 | Cho et al. | | |
| 2010/0163910 A1* | 7/2010 | Bougrov | H10H 20/831 | |
| | | | | 257/98 |
| 2011/0163346 A1* | 7/2011 | Seo | H10H 20/857 | |
| | | | | 257/E33.064 |
| 2013/0234192 A1* | 9/2013 | Kim | H10H 20/8314 | |
| | | | | 257/98 |
| 2014/0209955 A1 | 7/2014 | Kim et al. | | |
| 2014/0231859 A1* | 8/2014 | Kim | H10H 20/831 | |
| | | | | 257/99 |
| 2014/0291714 A1* | 10/2014 | Jeon | H10H 20/814 | |
| | | | | 257/98 |
| 2015/0171298 A1* | 6/2015 | Cho | H10H 20/835 | |
| | | | | 257/98 |
| 2016/0013388 A1* | 1/2016 | Lee | H10H 20/8316 | |
| | | | | 257/13 |
| 2016/0043280 A1* | 2/2016 | Moon | H10H 20/8316 | |
| | | | | 257/97 |
| 2016/0126413 A1* | 5/2016 | Kim | H10H 20/813 | |
| | | | | 257/13 |
| 2016/0211410 A1* | 7/2016 | Jang | H10H 29/14 | |
| 2018/0019378 A1* | 1/2018 | Seong | H10H 20/831 | |
| 2018/0069154 A1* | 3/2018 | Dobrinsky | H10H 20/835 | |
| 2018/0076360 A1* | 3/2018 | Chae | H10H 29/10 | |
| 2018/0076362 A1* | 3/2018 | Jeon | H10H 20/83 | |
| 2018/0182922 A1* | 6/2018 | Emura | H10H 20/835 | |
| 2018/0219133 A1 | 8/2018 | Park et al. | | |
| 2019/0148596 A1 | 5/2019 | Park et al. | | |
| 2019/0229242 A1* | 7/2019 | Yoon | H10H 20/833 | |
| 2020/0006612 A1* | 1/2020 | Lee | H10H 20/833 | |
| 2020/0220049 A1* | 7/2020 | Oh | H10H 20/814 | |
| 2020/0295229 A1* | 9/2020 | Kim | H10H 20/8312 | |
| 2021/0043803 A1* | 2/2021 | Wang | H10H 20/841 | |
| 2021/0193875 A1* | 6/2021 | Kopp | H10H 20/8312 | |
| 2021/0336090 A1* | 10/2021 | Yang | H10H 29/142 | |

FOREIGN PATENT DOCUMENTS

| | | | | |
|---|---|---|---|---|
| KR | 1020060018300 A | | 3/2006 | |
| KR | 100878396 B1 | | 1/2009 | |
| KR | 20120041646 A | * | 5/2012 | H10H 20/857 |
| KR | 1020180008198 A | | 1/2018 | |
| KR | 20180083159 A | * | 7/2018 | H01L 25/0753 |
| KR | 1020190010988 A | | 2/2019 | |
| KR | 101958419 B1 | | 3/2019 | |
| WO | 2017034356 A1 | | 3/2017 | |

OTHER PUBLICATIONS

English translation of International Search Report for International Application No. PCT/KR2021/009184, Nov. 2, 2021, 2 pages.

Office Action for corresponding Korean Patent Application No. 10-2021-0092721, Mar. 10, 2026, 6 pages (no English translation available).

* cited by examiner

DEEP ULTRAVIOLET LIGHT-EMITTING DIODE

CROSS-REFERENCE TO RELATED APPLICATIONS AND PRIORITY

This application is a continuation of International Application No. PCT/KR2021/009184, filed on 16 Jul. 2021, which claims priority to and the benefit of Korean Application No. 10-2020-0088594, filed on 17 Jul. 2020, and Korean Application No. 10-2021-0092721, filed on 15 Jul. 2021, the disclosures of which are hereby incorporated by reference for all purposes as if fully set forth herein.

TECHNICAL FIELD

The present disclosure relates to an inorganic semiconductor light emitting diode, and more particularly to a light emitting diode emitting deep UV light of 300 nm or less.

BACKGROUND ART

In general, a light emitting diode emitting UV light within a range of 200 nm to 300 nm can be used in various applications, including a sterilization device, a water or air purification device, a high-density optical recording device, and an excitation source for a bio-aerosol fluorescence detection system.

Unlike a near-UV light emitting diode or a blue light emitting diode, a light emitting diode that emits relatively deep UV light includes a well layer containing Al, such as AlGaN. Due to a composition of this gallium nitride-based semiconductor layer, a deep UV light emitting diode has a structure significantly different from that of the blue light emitting diode or the near UV light emitting diode.

In particular, the deep UV light emitting diode according to a prior art has a structure different from that of a general blue light emitting diode or near UV light emitting diode in a shape and a position of a mesa disposed on an n-type semiconductor layer. That is, the mesa is biased toward one side from a center of the n-type semiconductor layer, a p-bump is disposed on the mesa, and an n-bump is disposed near a side opposite to the one side to be spaced apart from the mesa.

Such a conventional UV light emitting diode generally has a disadvantage of low light output and high forward voltage. In particular, the deep UV light emitting diode achieves favorable internal quantum efficiency by improving a crystalline quality of the semiconductor layer, but light extraction efficiency is very low. The light extraction efficiency is reduced by total internal reflection and light loss in the interior. For example, a p-type GaN layer included for an-ohmic contact absorbs UV light generated in an active layer, and an n-ohmic contact layer adhered to the n-type semiconductor layer also absorbs UV light.

Furthermore, since it is difficult for the conventional UV light emitting diode to utilize light emitted to a side surface of the mesa, there is a tendency to reduce a total area of the side surface of the mesa as much as possible. That is, a width of the mesa is relatively wide. However, as the mesa width increases, a distance from the n-ohmic contact layer to a central region of the mesa increases, which is not favorable for current spreading, thereby increasing a forward voltage. Moreover, poor current spreading performance limits an increase in current density, thereby limiting a luminous intensity that can be achieved with individual light emitting diodes.

SUMMARY

Technical Problem

Exemplary embodiments of the present disclosure provide a deep UV light emitting diode having a novel structure that is configured to improve electrical characteristics and/or light output.

Exemplary embodiments of the present disclosure provide a deep UV light emitting diode that is configured to improve current spreading performance.

Technical Solution

A deep UV light emitting diode according to an exemplary embodiment of the present disclosure includes: a substrate; an n-type semiconductor layer disposed on the substrate; a mesa disposed on the n-type semiconductor layer, including an active layer and a p-type semiconductor layer, and having a plurality of via holes exposing the n-type semiconductor layer; n-ohmic contact layers contacting the n-type semiconductor layer in the via holes; a p-ohmic contact layer contacting the p-type semiconductor layer; an n-pad metal layer electrically connected to the n-ohmic contact layers; a p-pad metal layer electrically connected to the p-ohmic contact layer; an n-bump electrically connected to the n-pad metal layer; and a p-bump electrically connected to the p-pad metal layer, in which the p-pad metal layer is formed to surround the n-pad metal layer.

A light emitting diode according to another exemplary embodiment of the present disclosure includes: a substrate; an n-type semiconductor layer disposed on the substrate; a mesa disposed on the n-type semiconductor layer, including an active layer and a p-type semiconductor layer, and having a plurality of via holes exposing the n-type semiconductor layer; n-ohmic contact layers contacting the n-type semiconductor layer in the via holes; a p-ohmic contact layer contacting the p-type semiconductor layer; an n-bump electrically connected to the n-ohmic contact layers; and a p-bump electrically connected to the p-ohmic contact layer, in which the p-ohmic contact layer includes Ni/Rh.

A deep UV light emitting diode according to another exemplary embodiment of the present disclosure includes: a substrate; an n-type semiconductor layer disposed on the substrate; a mesa disposed on the n-type semiconductor layer, including an active layer and a p-type semiconductor layer, and including a groove exposing the n-type semiconductor layer; n-ohmic contact layers contacting the n-type semiconductor layer in the groove; a p-ohmic contact layer contacting the p-type semiconductor layer; an n-pad metal layer electrically connected to the n-ohmic contact layers; a p-pad metal layer electrically connected to the p-ohmic contact layer; an n-bump electrically connected to the n-pad metal layer; and a p-bump electrically connected to the p-pad metal layer.

Advantageous Effects

According to exemplary embodiments of the present disclosure, a deep UV light emitting diode that is configured to evenly spread current within a mesa may be provided by employing a plurality of via holes. Furthermore, a deep UV light emitting diode with improved light extraction efficiency may be provided by employing Ni/Rh as a p-type ohmic contact layer. In addition, since luminous intensities of individual light emitting diodes may be increased by increasing a current density injected into the light emitting diode, the number of light emitting diodes required to sterilize bacteria or viruses may be reduced, and a sterilization time may be reduced.

Advantages and features of the present disclosure will be discussed in detail in the detailed description or will become apparent from the detailed description.

DETAILED DESCRIPTION

Figure 1A:
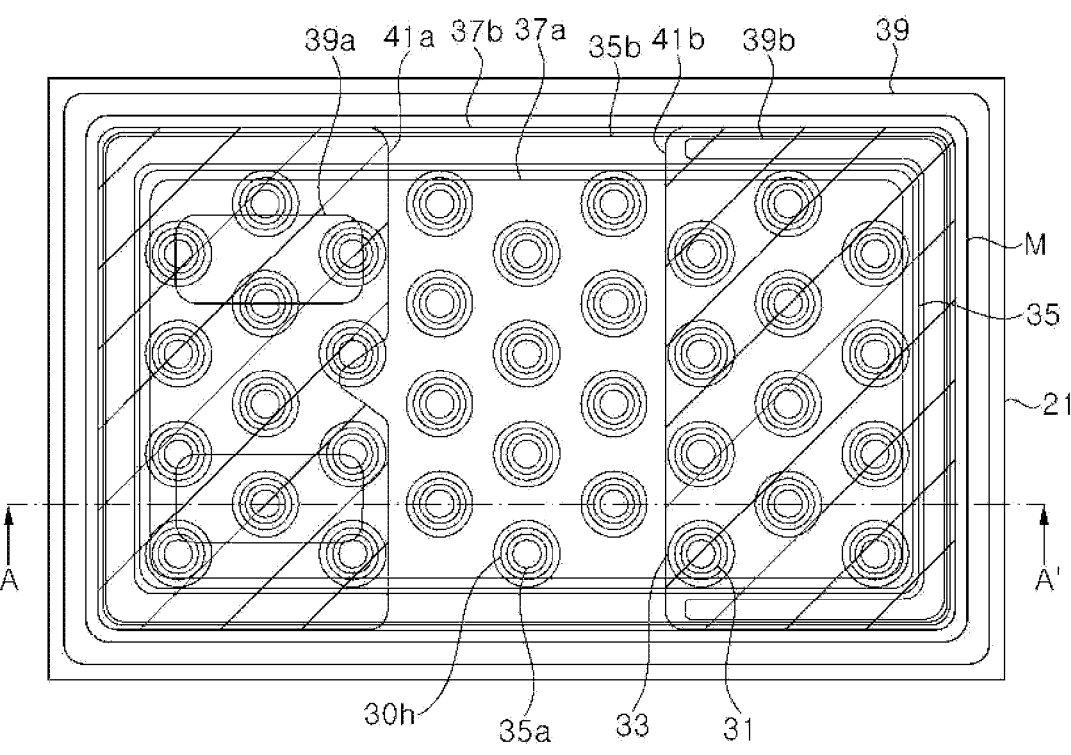
FIG. 1A is a schematic plan view illustrating a UV light emitting diode according to an exemplary embodiment of the present disclosure.

Hereinafter, embodiments will be described in detail with reference to the accompanying drawings. The following embodiments are provided by way of example so as to fully convey the spirit of the present disclosure to those skilled in the art to which the present disclosure pertains. Accordingly, the inventive concepts are not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Nitride-based semiconductor layers described below may be grown using generally known various methods, and may be grown using technology, for example, metal organic chemical vapor deposition (MOCVD), molecular beam epitaxy (MBE), hydration vapor phase epitaxy (HVPE), or the like. However, in exemplary embodiments described below, it is described that semiconductor layers are grown in a growth chamber using MOCVD. In a process of growing the nitride-based semiconductor layers, sources introduced into the growth chamber may be generally known sources, for example, TMGa, TEGa, or the like may be used as a Ga source, TMAl, TEAl, or the like may be used as an Al source, TMIn, TEIn, or the like may be used as an In source, and NH3 may be used as a N source. However, the inventive concepts are not limited thereto.

A deep UV light emitting diode according to an exemplary embodiment of the present disclosure includes: a substrate; an n-type semiconductor layer disposed on the substrate; a mesa disposed on the n-type semiconductor layer, including an active layer and a p-type semiconductor layer, and having a plurality of via holes exposing the n-type semiconductor layer; n-ohmic contact layers contacting the n-type semiconductor layer in the via holes; a p-ohmic contact layer contacting the p-type semiconductor layer; an n-pad metal layer electrically connected to the n-ohmic contact layers; a p-pad metal layer electrically connected to the p-ohmic contact layer; an n-bump electrically connected to the n-pad metal layer; and a p-bump electrically connected to the p-pad metal layer, in which the p-pad metal layer is formed to surround the n-pad metal layer.

By forming the plurality of via holes inside the mesa, it is possible to uniformly spread current, and further, it is possible to prevent a non-emission region from being formed inside the mesa. Conventionally, when a width of the mesa is wide, a distance from the n-ohmic contact layer to the inside of the mesa increases to form the non-emission region. On the contrary, in the present application, the current inside the mesa may be evenly spread by disposing the plurality of via holes inside the mesa, and by forming the n-ohmic contact layers in the via holes.

In an exemplary embodiment, the via holes may be arranged in a honeycomb shape. Accordingly, the via holes may be spaced apart from one another at equal intervals, and thus, the current may be evenly spread.

Meanwhile, the via-holes may be spaced apart from an edge of the mesa by a distance greater than or equal to a distance between the via-holes.

The n-pad metal layer may cover the via holes.

The p-pad metal layer may be disposed between the via holes and the edge of the mesa.

The n-bump and the p-bump may be disposed within an upper region of the mesa.

Accordingly, light may be emitted through a side surface of the mesa.

The deep UV light emitting diode may further include a lower insulation layer covering the p-ohmic contact layer and the n-ohmic contact layer, in which the lower insulation layer has openings exposing the p-ohmic contact layer and the n-ohmic contact layer, and the n-pad metal layer and the p-pad metal layer may be electrically connected to the n-ohmic contact layer and the p-ohmic contact layer through the openings of the lower insulation layer, respectively.

An upper insulation layer covering the n- and p-pad metal layers may be further included, in which the upper insulation layer has openings exposing the n-pad metal layer and the p-pad metal layer, the n-bump and the p-bump may be disposed on the upper insulation layer, and may be electrically connected to the n-pad metal layer and the p-pad metal layer through the openings of the upper insulation layer, respectively.

In an embodiment, the opening exposing the n-pad metal layer is disposed near one edge of the mesa, and the opening exposing the p-pad metal layer is disposed near an opposite edge of the mesa.

In an exemplary embodiment, the p-type semiconductor layer may include a p-type GaN layer, and the p-type GaN layer may have a thickness of 200 nm or less. Furthermore, the p-ohmic contact layer may include Ni/Rh.

In an exemplary embodiment, the n-pad metal layer may include an Al layer.

A light emitting diode according to another exemplary embodiment of the present disclosure includes: a substrate; an n-type semiconductor layer disposed on the substrate; a mesa disposed on the n-type semiconductor layer, including an active layer and a p-type semiconductor layer, and having a plurality of via holes exposing the n-type semiconductor layer; n-ohmic contact layers contacting the n-type semiconductor layer in the via holes; a p-ohmic contact layer contacting the p-type semiconductor layer; an n-bump electrically connected to the n-ohmic contact layers; and a p-bump electrically connected to the p-ohmic contact layer, in which the p-ohmic contact layer includes Ni/Rh.

The plurality of via holes may be spaced apart from one another at equal intervals, and may be arranged in a honeycomb shape.

Furthermore, the deep UV light emitting diode may further include a lower insulation layer covering the n-ohmic contact layers and the p-ohmic contact layer; and an n-pad metal layer and a p-pad metal layer disposed on the lower insulation layer, in which the lower insulation layer has openings exposing the n-ohmic contact layers and the p-ohmic contact layer, respectively, the n-pad metal layer and the p-pad metal layer may be electrically connected to the n-ohmic contact layers and the p-ohmic contact layer through the openings, respectively, and the n-bump and p-bump may be electrically connected to the n-pad metal layer and the p-pad metal layer, respectively.

The p-pad metal layer may surround the n-pad metal layer.

In addition, the opening exposing the p-ohmic contact layer may have a ring shape surrounding the via holes.

In an embodiment, the p-pad metal layer may be disposed within an upper portion of a region between the via holes and an edge of the mesa. Accordingly, the p-pad metal layer does not cover a side surface of the mesa.

The deep UV light emitting diode may further include an upper insulation layer including the n-pad metal layer and the p-pad metal layer, in which the upper insulation layer has openings exposing the n-pad metal layer and the p-pad metal layer, and the n-bump and the p-bump may be electrically connected to the n-pad metal layer and the p-pad metal layer through the openings of the upper insulation layer, respectively.

The lower insulation layer and the upper insulation layer may cover the side surface of the mesa.

Meanwhile, the opening exposing the n-pad metal layer may be disposed near one edge of the mesa, and the opening exposing the p-pad metal layer may be disposed near an opposite edge of the mesa.

The p-type semiconductor layer may include a p-type GaN layer, the p-type GaN layer may have a thickness of 200 nm or less, and the Ni/Rh may be in ohmic contact with the p-type GaN layer.

A deep UV light emitting diode according to another exemplary embodiment of the present disclosure includes: a substrate; an n-type semiconductor layer disposed on the substrate; a mesa disposed on the n-type semiconductor layer, including an active layer and a p-type semiconductor layer, and including a groove exposing the n-type semiconductor layer; n-ohmic contact layers contacting the n-type semiconductor layer in the groove; a p-ohmic contact layer contacting the p-type semiconductor layer; an n-pad metal layer electrically connected to the n-ohmic contact layers; a p-pad metal layer electrically connected to the p-ohmic contact layer; an n-bump electrically connected to the n-pad metal layer; and a p-bump electrically connected to the p-pad metal layer.

The deep UV light emitting diode may include an n capping layer covering the n-ohmic contact layers; and a p-capping layer covering the p-ohmic contact layer.

The groove extends in a longitudinal direction of the mesa, and a difference between a length of the mesa in the longitudinal direction and a length of the groove may be smaller than or equal to a width of each mesa region disposed on both sides of the groove.

A sum of areas of the mesa regions disposed on both sides of the groove may exceed ½ of a total area of the mesa.

Corners of one end of the mesa region disposed on both sides of the groove may have a curved shape.

Depressions may be formed at outer corners among the corners of one end of the mesa region disposed on both sides of the groove, respectively.

The groove may include a main groove extending in the longitudinal direction of the mesa; and a plurality of sub grooves extending in a direction perpendicular to the main groove.

The plurality of sub grooves may include grooves having different lengths and different widths.

The deep UV light emitting diode may have a symmetric structure with respect to a line passing through a center and parallel to the sub groove.

The deep UV light emitting diode may have an asymmetric structure with respect to the line passing through the center and parallel to the main groove.

Hereinafter, embodiments of the present disclosure will be described in detail with reference to the drawings.

Figure 1B:
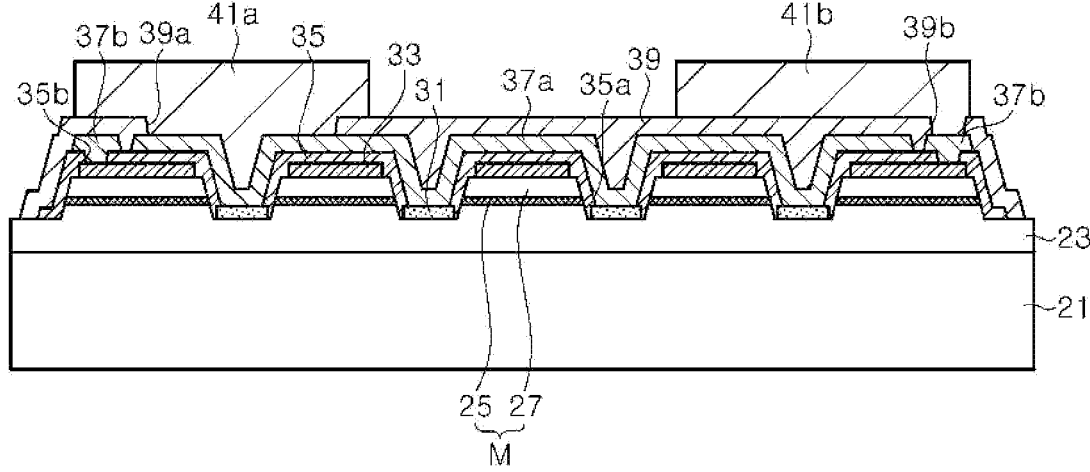
FIG. 1B is a schematic cross-sectional view taken along line A-A' in FIG. 1A.

FIG. 1A is a schematic plan view illustrating a UV light emitting diode according to an exemplary embodiment of the present disclosure, and FIG. 1B is a schematic cross-sectional view taken along line A-A' of its corresponding plan view shown in FIG. 1A.

Referring to FIG. 1A and FIG. 1B, the UV light emitting diode according to the illustrated exemplary embodiment may include a substrate 21, an n-type semiconductor layer 23, an active layer 25, a p-type semiconductor layer 27, n-ohmic contact layers 31, a p-ohmic contact layer 33, a lower insulation layer 35, an n-pad metal layer 37a, a p-pad metal layer 37b, an upper insulation layer 39, an n-bump 41a, and a p-bump 41b.

The substrate 21 is not particularly limited as long as it is a substrate capable of growing a nitride-based semiconductor, and may include, for example, a heterogeneous substrate such as a sapphire substrate, a silicon substrate, a silicon carbide substrate, a spinel substrate, or the like, or may include a homogeneous substrate such as a gallium nitride substrate, an aluminum nitride substrate, or the like.

The n-type semiconductor layer 23 is disposed on the substrate 21. The n-type semiconductor layer 23 may include, for example, an AlN buffer layer (about 3.79 μm) and an n-type AlGaN layer. The n-type AlGaN layer may include a lower n-type AlGaN layer (about 2.15 μm) with an Al molar ratio of 0.8 or more, an intermediate AlGaN layer (1.7 nm) with an Al molar ratio of 0.7 to 0.8, and an upper n-type AlGaN layer with a thickness of about 66.5 nm. The n-type semiconductor layer 23 is formed of a nitride-based semiconductor having a band gap higher than that of the active layer such that light generated in the active layer passes therethrough. When the gallium nitride-based semi-conductor layer is grown on the sapphire substrate 21, the n-type semiconductor layer 23 may generally include a plurality of layers so as to improve a crystalline quality.

A mesa M is disposed on a partial region of the n-type semiconductor layer 23. The mesa M includes the active layer 25 and the p-type semiconductor layer 27. In general, after the n-type semiconductor layer 23, the active layer 25, and the p-type semiconductor layer 27 are sequentially grown, the mesa M is formed by patterning the p-type semiconductor layer 27 and the active layer 25 through a mesa etching process.

The active layer 25 may be a single quantum well structure or a multi-quantum well structure including a well layer and a barrier layer. The well layer may be formed of AlGaN or AlInGaN, and the barrier layer may be formed of AlGaN or AlInGaN having a band gap wider than the well layer. For example, each well layer may be formed of AlGaN having an Al molar ratio of about 0.5 with a thickness of about 3.1 nm, and each barrier layer may be formed of AlGaN having an Al molar ratio of 0.7 or more with a thickness of about 9 nm or more. In particular, a first barrier layer may be formed to be thicker than other barrier layers with a thickness of 12 nm or more. Meanwhile, AlGaN layers having an Al molar ratio of 0.7 to 0.8 in contact with atop and a bottom of each well layer may be disposed in a thickness of about 1 nm, respectively. However, an Al molar ratio of the AlGaN layer in contact with a last well layer may be 0.8 or more in consideration of the contact with an electron blocking layer.

Meanwhile, the p-type semiconductor layer 27 may include an electron blocking layer and a p-type GaN contact layer. The electron blocking layer prevents electrons from overflowing from the active layer to the p-type semiconduc-tor layer, thereby improving a recombination rate of elec-trons and holes. The electron blocking layer may be formed of, for example, p-type AlGaN having an Al molar ratio of about 0.8, and may have a thickness of, for example, 55 nm. Meanwhile, the p-type GaN contact layer may be formed to have a thickness of about 300 nm. The electron blocking layer may be omitted.

Meanwhile, the p-type GaN contact layer is used for an ohmic contact. The p-type GaN contact layer may absorb light generated in the active layer 25. A prior art does not solve a drawback of UV absorption by the p-type GaN contact layer. The present invention reduces light absorption of the p-type GaN contact layer by reducing the thickness of the p-type GaN contact layer. In the prior art, the p-type GaN contact layer is generally formed to have a thickness of more than 300 nm, but in the illustrated exemplary embodiment, it is formed to have a thickness of 200 nm or less, further 150 nm or less. As such, light absorption by the p-type GaN contact layer may be reduced to improve light extraction efficiency.

The mesa M may have a rectangular shape elongated in one direction, and includes a plurality of via holes 30h exposing the n-type semiconductor layer 23. Each of the via holes 30h may have a concentric circle shape, and may be arranged at substantially equal intervals to one another in a region of the mesa M. As well illustrated in FIG. 2A, the via-holes 30h may be arranged in a honeycomb shape, and thus, it is possible to make intervals between the via-holes 30h uniform.

The via holes 30h may have a mirror symmetrical struc-ture with respect to a plane passing in a short axis direction of the mesa M. This mirror symmetrical structure assists to spread currents in the mesa M to improve a radiation efficiency.

Meanwhile, the n-ohmic contact layers 31 are disposed on the n-type semiconductor layer 23 exposed to the via holes 30h. The n-ohmic contact layers 31 may be formed by depositing a plurality of metal layers, and thereafter, by alloying the metal layers through a rapid thermal alloy (RTA) process. For example, the n-ohmic contact layers 31 may be alloyed through the RTA process after sequentially depositing Cr/Ti/Al/Ti/Au. Accordingly, the n-ohmic con-tact layers 31 become alloy layers containing Cr, Ti, Al, and Au.

The n-ohmic contact layers 31 are disposed in the via holes 30h, respectively. The n-ohmic contact layers 31 are spaced apart from the active layer 25 and the p-type semi-conductor layer 27 in the via holes 30h. In a deep UV light emitting diode according to the prior art, an n-ohmic contact layer is generally formed to surround the mesa M along a perimeter of the mesa M, but in the illustrated exemplary embodiment, the n-ohmic contact layer is not disposed around the mesa M. Accordingly, it is possible to prevent light emitted through a side surface of the mesa M from being blocked by the n-ohmic contact layer 31 or the like.

The p-ohmic contact layer 33 is disposed on the p-type semiconductor layer 27 to be in ohmic contact with the p-type semiconductor layer 27. The p-ohmic contact layer 33 may be formed through, for example, the RTA process after depositing Ni/Rh. The p-ohmic contact layer 33 is in ohmic contact with the p-type semiconductor layer 27, and covers most of an upper region of the mesa M, for example, 80% or more. Rh has a higher reflectivity to UV rays than Au, which is advantageous for improving light extraction efficiency. In this specification, since the thickness of the p-type GaN contact layer is reduced to decrease light absorption by the p-type GaN contact layer, so as to reflect light passing through the p-type semiconductor layer 27, favorable reflection performance of the p-ohmic contact layer 33 is required.

The lower insulation layer 35 covers the mesa M, and covers the p-ohmic contact layer 33 and the n-ohmic contact layers 31. The lower insulation layer 35 also covers the exposed n-type semiconductor layer 23 around the mesa M and in the via holes 30h. Meanwhile, the lower insulation layer 35 has openings 35a for allowing electrical connection to the n-ohmic contact layers 31 and openings 35b for allowing electrical connection to the p-ohmic contact layer 33. The opening 35b may be formed so as to surround all of the via holes 30h in a ring shape.

The lower insulation layer 35 may be formed of, for example, $SiO_2$, without being limited thereto, or may be formed as a distributed Bragg reflector.

Meanwhile, the n-pad metal layer 37a and the p-pad metal layer 37b are disposed on the lower insulation layer 35. The n-pad metal layer 37a and the p-pad metal layer 37b may be formed together in a same process as a same metal layer and disposed on a same level, that is, on the lower insulation layer 35. The n- and p-pad metal layers 37a and 37b may include, for example, Al layers.

The n-pad metal layer 37a is electrically connected to the n-ohmic contact layers 31 through the openings 35a of the lower insulation layer 35. The n-ohmic contact layers 31 are electrically connected to one another by the n-pad metal layer 37a. The n-pad metal layer 37a may be disposed within the region of the mesa M. The n-pad metal layer 37a may function as a reflection layer (second reflection layer) that reflects light emitted through the side surface of the mesa M in the via hole 30h, thereby improving a light efficiency of the light emitting diode.

Meanwhile, the p-pad metal layer 37b may be electrically connected to the p-ohmic contact layer 33 through the opening 35b of the lower insulation layer 35. The p-pad metal layer 37b may cover the opening 35b, and may surround the n-pad metal layer 37a in a ring shape. The p-pad metal layer 37b may be defined in the upper region of the mesa M such that the p-pad metal layer does not cover side surfaces of the mesa M.

The upper insulation layer 39 covers the n-pad metal layer 37a and the p-pad metal layer 37b. Meanwhile, the upper insulation layer 39 has openings 39a exposing the n-pad metal layer 37a and has openings 39b over the mesa M exposing the p-pad metal layer 37b. The opening 39a may expose the n-pad metal layer 37a near one edge of the mesa M, and the opening 39b may expose the p-pad metal layer 37b near an opposite edge of the mesa M.

A plurality of openings 39a may be arranged, without being limited thereto, or one opening 39a may be arranged. In addition, although the opening 39b is illustrated as being continuously formed in a C shape in the drawing, the plurality of openings 39b may be disposed apart from one another. The upper insulation layer 39 may be formed of, for example, silicon nitride or silicon oxide.

The n-bump 41a and the p-bump 41b are placed on the upper insulation layer 39. The n-bump 41a covers the openings 39a and is connected to the n-pad metal layer 37a exposed through the openings 39a. The n-bump 41a is electrically connected to the n-type semiconductor layer 23 through the n-pad metal layer 37a and the n-ohmic contact layer 31. Outer edges of the n-bump 41a and the p-bump 41b may be disposed over the mesa M so as not to cover the side surface of the mesa M.

The p-bump 41b covers the opening 39b and is connected to the p-pad metal layer 37b exposed through the opening 39b. The p-bump 41b is electrically connected to the p-type semiconductor layer 27 through the p-pad metal layer 37b and the p-ohmic contact layer 33.

The n-bump 41a and the p-bump 41b may be formed of, for example, Ti/Au/Cr/Au. As shown in FIG. 1, the n-bump 41a and the p-bump 41b may be disposed to face each other, and may occupy about ⅓ of an area of the mesa M, respectively. By making the areas of the n-bump 41a and the p-bump 41b relatively wide, heat generated in the light emitting diode may be easily dissipated, thereby improving a performance of the light emitting diode.

Furthermore, the openings 39a and 39b are covered by the n-bump 41a and the p-bump 41b, and thus, moisture or solder from the outside may be prevented from infiltrating into a device through the openings 39a and 39b, thereby improving a reliability thereof.

Meanwhile, although not shown, an anti-reflection layer may be disposed on a light exiting surface of the substrate 21. The anti-reflection layer may be formed of a transparent insulation layer such as $SiO_2$ to have a thickness that is an integer multiple of ¼ of a wavelength of ultraviolet rays, for example. Alternatively, a bandpass filter in which layers having different refractive indices are repeatedly stacked may be used as the anti-reflection layer.

FIGS. 2A, 3A, 4A, 5A, 6A, 7A, and 8A are schematic plan views illustrating a method of manufacturing a UV light emitting diode according to an exemplary embodiment of the present disclosure, and FIGS. 2B, 3B, 4B, 5B, 6B, 7B, and 8B are schematic cross-sectional views taken along line A-A' of their corresponding plan views shown in FIGS. 2A, 3A, 4A, 5A, 6A, 7A, and 8A, respectively.

Figure 2A:
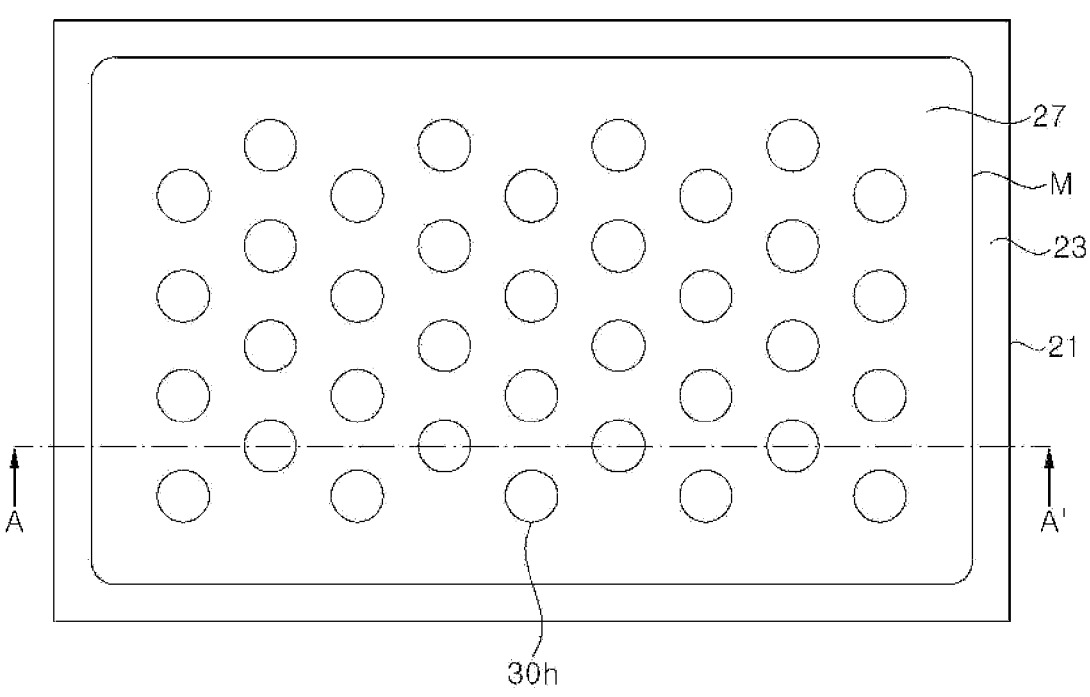
FIGS. 2A, 3A, 4A, 5A, 6A, 7A, and 8A are schematic plan views illustrating a method of manufacturing a UV light emitting diode according to an exemplary embodiment of the present disclosure.
Figure 2B:
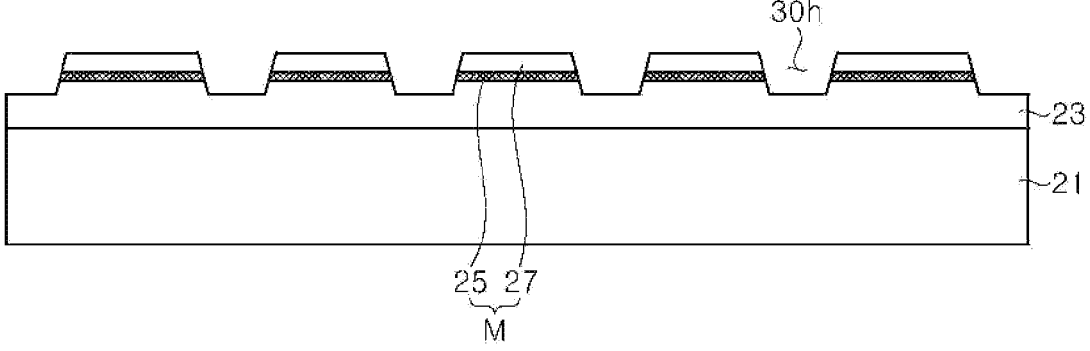
FIGS. 2B, 3B, 4B, 5B, 6B, 7B, and 8B are schematic cross-sectional views taken along line A-A' of their corresponding plan views shown in FIGS. 2A, 3A, 4A, 5A, 6A, 7A, and 8A, respectively.

Referring to FIGS. 2A and 2B, first, an n-type semiconductor layer 23, an active layer 25, and a p-type semiconductor layer 27 are grown on a substrate 21.

Since the substrate 21, the n-type semiconductor layer 23, the active layer 25, and the p-type semiconductor layer 27 are identical to those described above, detailed descriptions thereof will be omitted to avoid redundancy. However, the p-type semiconductor layer 27 may include a semiconductor layer having a band gap smaller than a well layer of the active layer 25, for example, a GaN layer. In particular, a p-type GaN layer may be used for an ohmic contact. The semiconductor layer having the band gap smaller than the well layer is controlled to have a thickness of 200 nm or less, furthermore, 150 nm or less.

Meanwhile, a mesa M is formed by patterning the p-type semiconductor layer 27 and the active layer 25. The mesa M may have a generally elongated rectangular shape, but the inventive concepts are not limited to a specific shape. As the mesa M is formed, the n-type semiconductor layer 23 may be exposed along a perimeter of the mesa M. Also, a plurality of via holes 30h are formed in a mesa M region. The via holes 30h expose the n-type semiconductor layer 23. The via holes 30h may be spaced apart from one another at substantially equal intervals, and may be arranged, for example, in a honeycomb structure. Furthermore, the via-holes 30h may be spaced apart from an edge of the mesa M by more than the interval between the via-holes 30h.

Figure 3A:
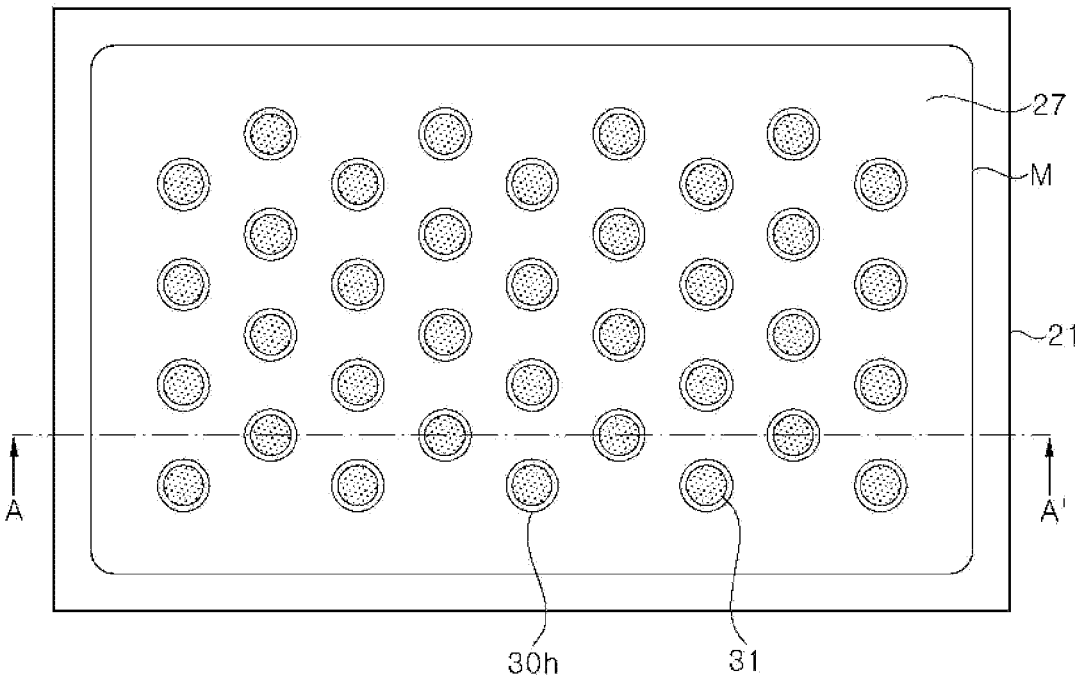
Figure 3B:
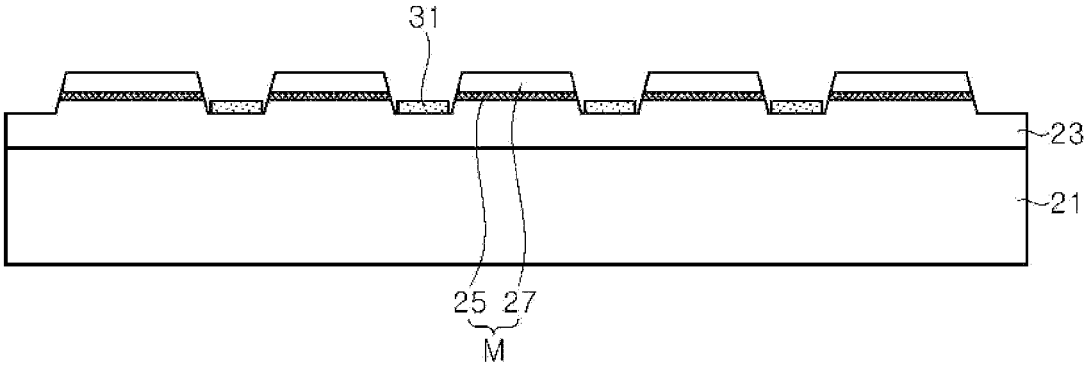

Referring to FIG. 3A and FIG. 3B, n-ohmic contact layers 31 are formed on bottom surfaces of the via holes 30h. The n-ohmic contact layers 31 may be alloyed through an RTA process, for example, after sequentially depositing Cr/Ti/Al/ Ti/Au. For example, the n-ohmic contact layer 31 may be alloyed through the RTA process at about 965° C. for 30 seconds.

Figure 4A:
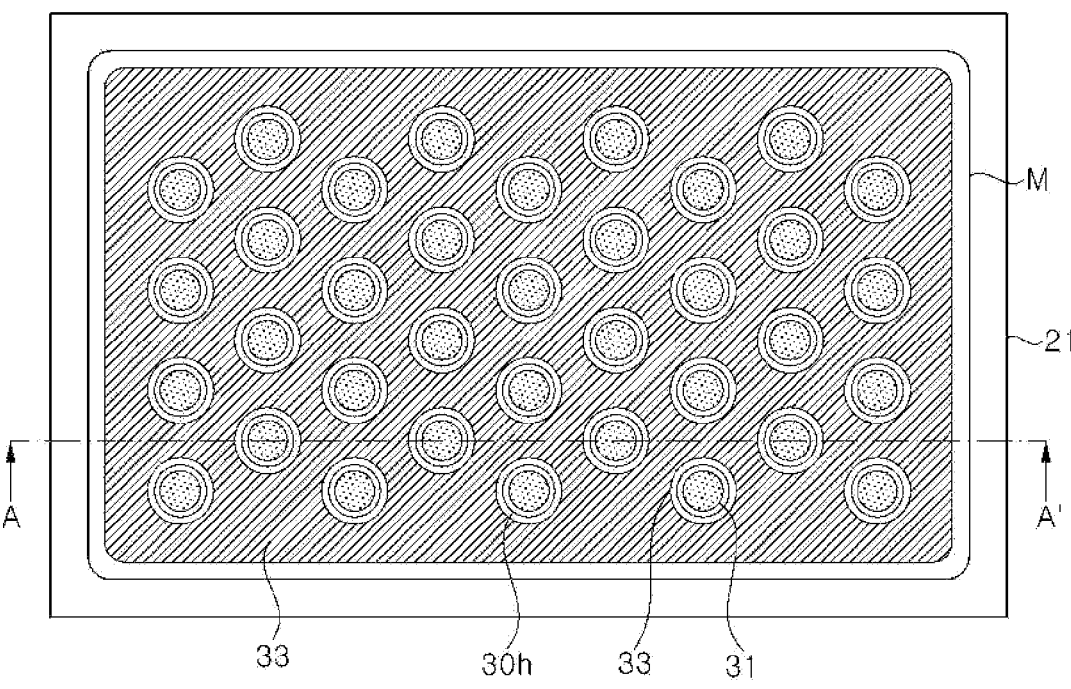
Figure 4B:
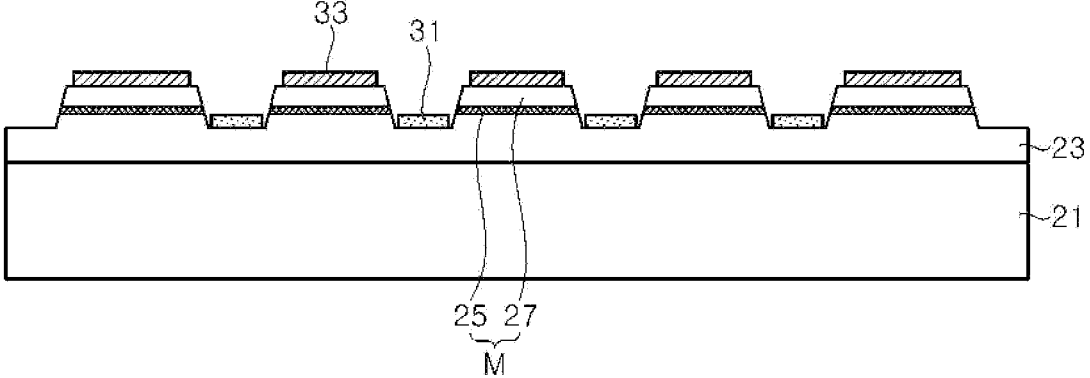

Referring to FIG. 4A and FIG. 4B, after the n-ohmic contact layer 31 is formed, a p-ohmic contact layer 33 is formed on the mesa M. The p-ohmic contact layer 33 is in ohmic contact with the p-type semiconductor layer 27. In particular, the p-ohmic contact layer 33 may be in ohmic contact with the p-type GaN layer.

The p-ohmic contact layer 33 may include a reflection metal layer such as Au or Rh. For example, after depositing Ni/Au or Ni/Rh, it may be alloyed through the RTA process. Ni/Au may be heat-treated, for example, at 590° C. for 80 seconds. In contrast, Ni/Rh may be heat-treated at a relatively lower temperature for a longer time, for example, may be heat-treated at 500° C. for 5 minutes. Rh has a higher reflectivity to UV rays than Au, and thus, the light extraction efficiency may be further increased.

Furthermore, Ni/Rh is advantageous compared to Ni/Au because an interface between the p-type contact layer 27 and the p-ohmic contact layer 33 is formed smoothly to exhibit stable ohmic resistance characteristics. In addition, since the present invention reduces light absorption of the p-type contact layer 27 by reducing a thickness of the p-type GaN contact layer, an amount of light reflected by the p-ohmic contact layer 33 is increased. Accordingly, the light extraction efficiency may be improved by using Rh having a relatively high reflectivity.

Figure 5A:
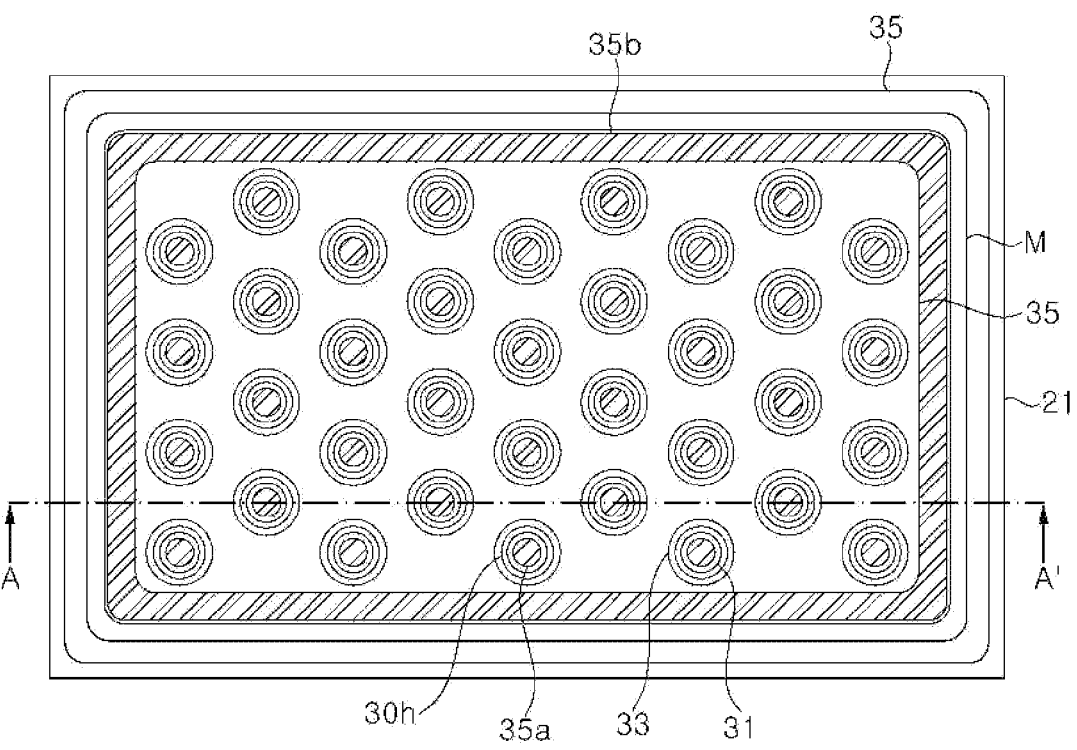
Figure 5B:
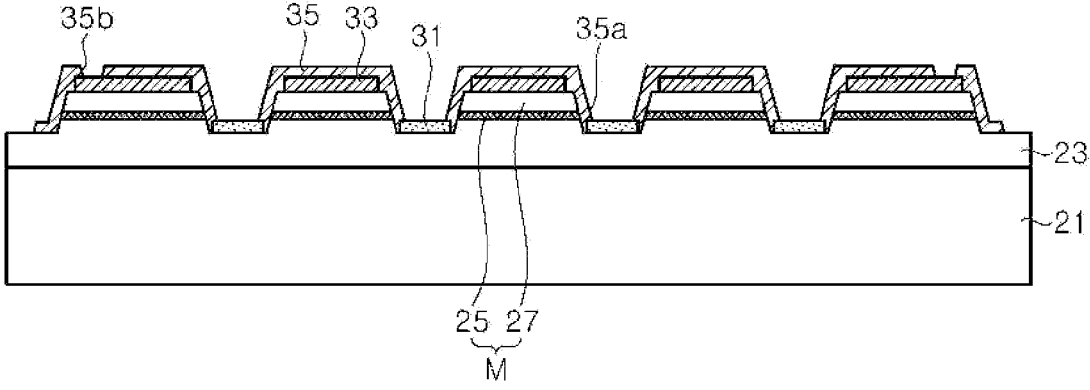

Referring to FIG. 5A and FIG. 5B, a lower insulation layer 35 is formed on the mesa M. The lower insulation layer 35 covers side surfaces and an upper surface of the mesa M. The lower insulation layer 35 covers the n-ohmic contact layer 31 and the p-ohmic contact layer 33. Meanwhile, the lower insulation layer 35 has openings 35a exposing the n-ohmic contact layers 31 and openings 35b exposing the p-ohmic contact layer 33.

The opening 35b of the lower insulation layer 35 may be formed in a ring shape along an entire perimeter of the via holes 30h. However, the inventive concepts are not limited thereto, and a plurality of openings may be formed so as to expose the p-ohmic contact layer 33. For example, a portion of the ring-shaped opening 35b close to the via holes 30h may be covered with the lower insulation layer 35, and openings may be formed in portions thereof relatively far from the via holes 30h.

Figure 6A:
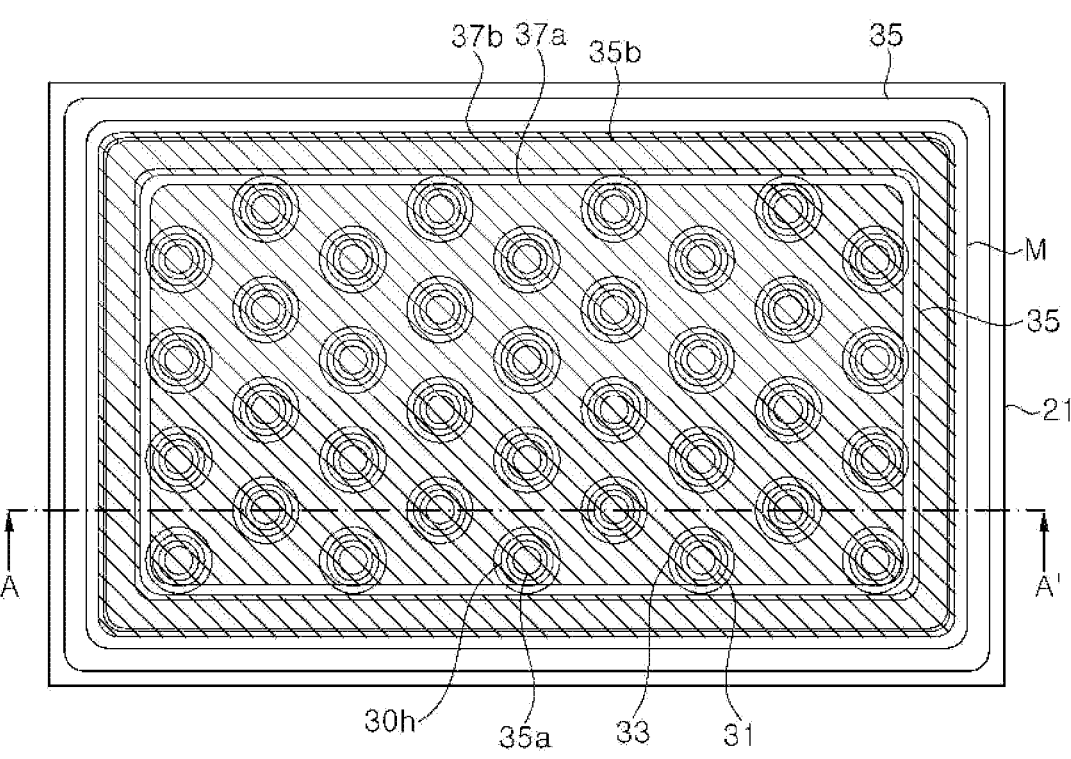
Figure 6B:
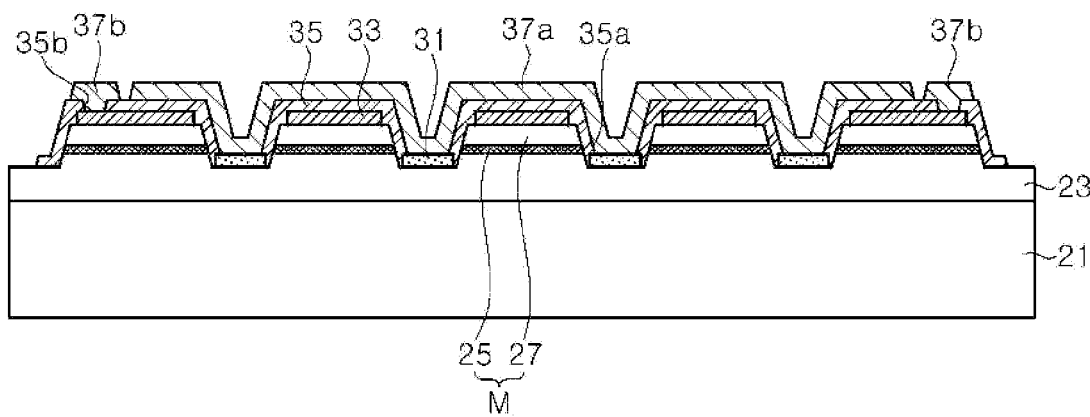

Referring to FIG. 6A and FIG. 6B, an n-pad metal layer 37a and a p-pad metal layer 37b are formed on the lower insulation layer 35. The n-pad metal layer 37a may be formed so as to cover the via-holes 30h, and may be electrically connected to the n-ohmic contact layers 31 in the via-holes 30h. The n-pad metal layer 37a may also cover inner walls of the via holes 30h.

The p pad metal layer 37b may cover the opening 35b, and may be electrically connected to the p-ohmic contact layer 33 exposed to the opening 35b. The p-pad metal layer 37b may be formed in a ring shape so as to surround the n-pad metal layer 37a. The p-pad metal layer 37b may be formed so as to cover the side surface of the mesa M, or may be formed to be limited in a region over the mesa M so as not to block light emitted to the side surface of the mesa M.

Figure 7A:
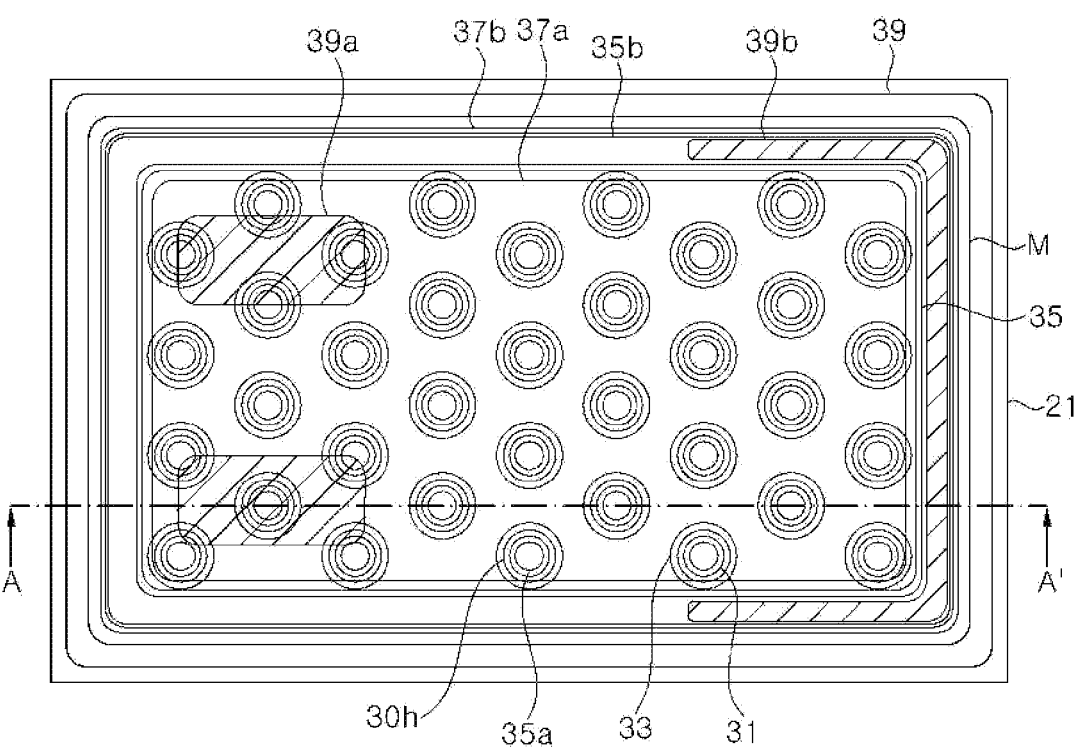
Figure 7B:
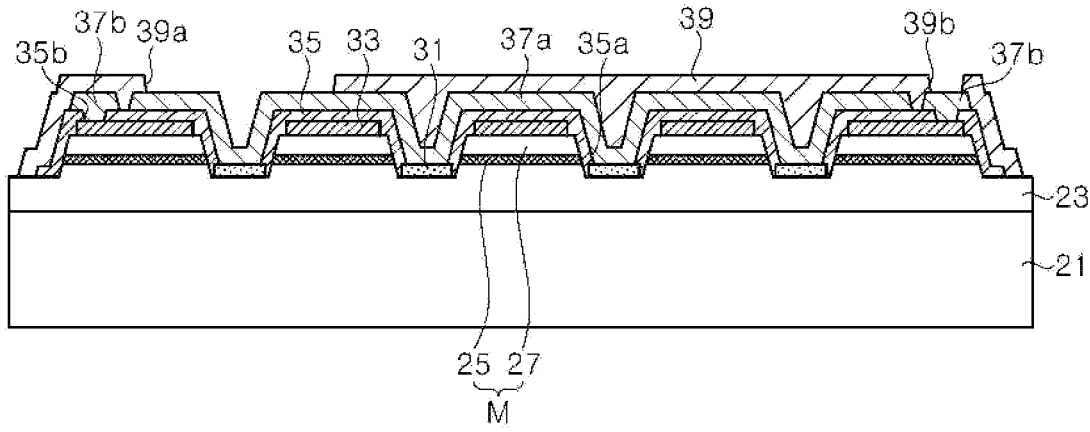

Referring to FIG. 7A and FIG. 7B, an upper insulation layer 39 is formed on the n-pad metal layer 37a and the p-pad metal layer 37b. The upper insulation layer 39 may cover the n-pad metal layer 37a and the p-pad metal layer 37b and may also cover the side surface of the mesa M.

Meanwhile, the upper insulation layer 39 has openings 39a and 39b exposing the n-pad metal layer 37a and the p-pad metal layer 37b. The openings 39a expose the n-pad metal layer 37a, and the openings 39b expose the p-pad metal layer 37b. The openings 39a may be formed near one edge of the mesa M, and the opening 39b may be formed near an opposite edge of the mesa M to face the openings 39a.

Figure 8A:
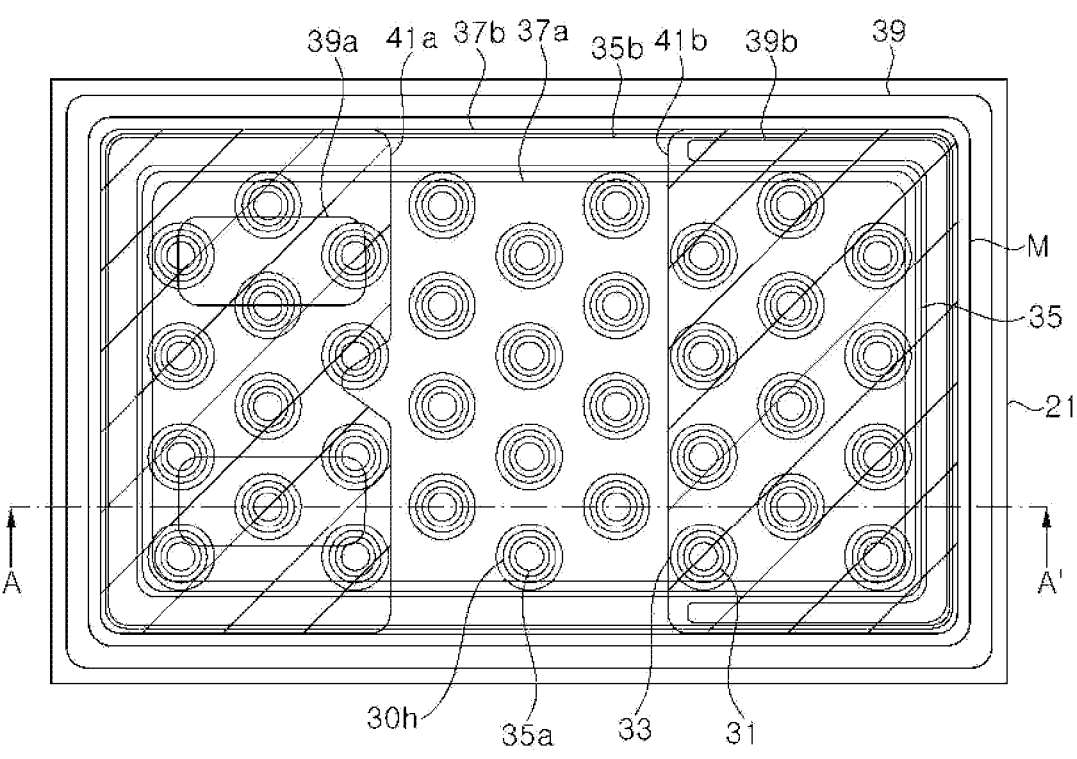
Figure 8B:
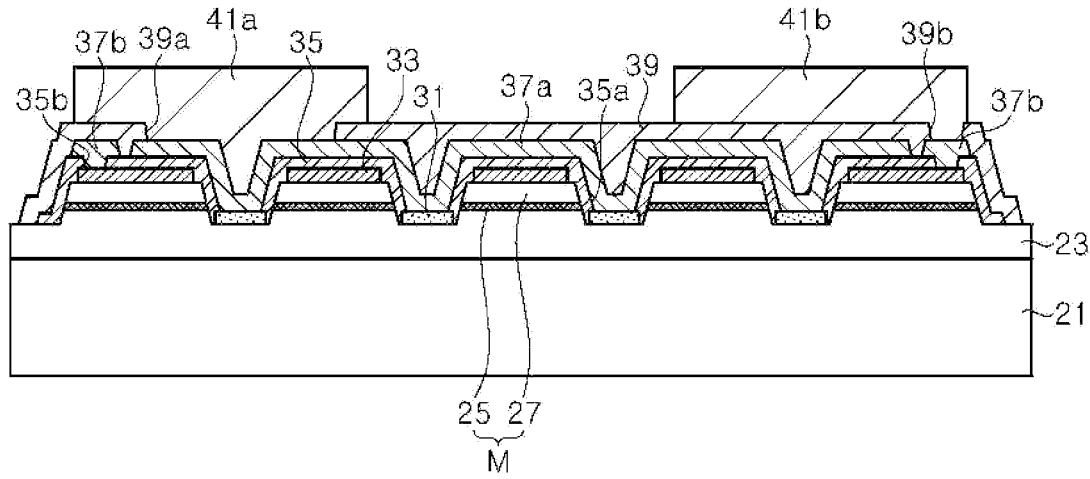

Referring to FIG. 8A and FIG. 8B, an n-bump 41a and a p-bump 41b are formed on the upper insulation layer 39. The n-bump 41a is electrically connected to the n-pad metal layer 37a through the openings 39a, and the p-bump 41b is electrically connected to the p-pad metal layer 37b through the opening 39b.

The n-bump 41a and p-bump 41b may partially cover the side surface of the mesa M, respectively, but may be formed so as to be limited a region over the mesa M.

According to the illustrated exemplary embodiment, current may be uniformly spread over an entire region of the mesa M by forming the via holes 30h in the mesa M region and forming the n-ohmic contact layers 31. In addition, the light extraction efficiency may be improved by reducing the thickness of the p-type GaN contact layer that absorbs light generated in the active layer 25 and by using Ni/Rh as the p-ohmic contact layer 33.

Figure 9:
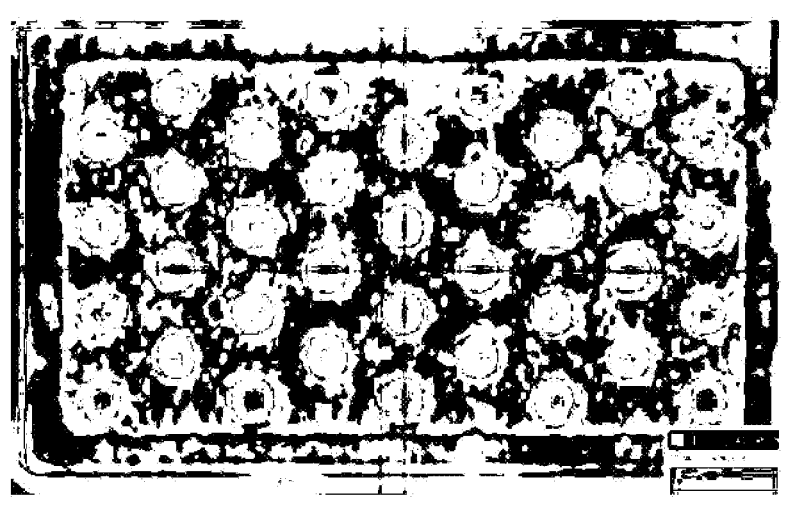
FIG. 9 is a diagram showing a light output distribution of a UV light emitting diode manufactured according to an exemplary embodiment of the present disclosure.

FIG. 9 is a diagram showing a light output distribution of the ultraviolet light emitting diode manufactured according to an exemplary embodiment of the present disclosure. Herein, the closer to red, the stronger ultraviolet light is emitted, and the closer to blue, the weaker light is emitted. Herein, an area of the light emitting diode was about 950 um×600 um, and a current of 100 mA was applied.

Referring to FIG. 9, it can be seen that light is emitted over almost an entire region of the mesa M, except for regions where the via holes 30h are disposed. Since current spreading is favorable, a luminous intensity of the light emitting diode may be further improved by increasing a current density.

Figure 10A:
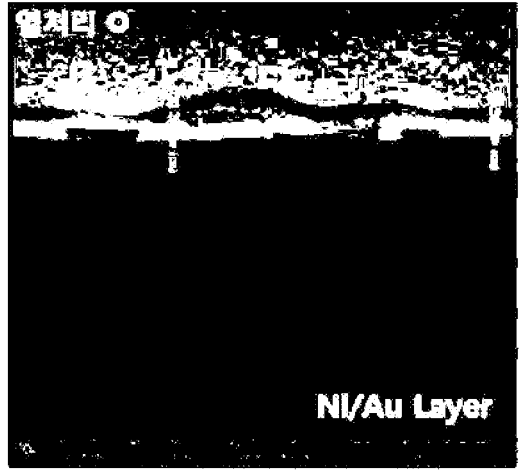
FIG. 10A is a cross-sectional SEM image showing an interface after depositing Ni/Au on a p-type contact layer and performing heat treatment.
Figure 10B:
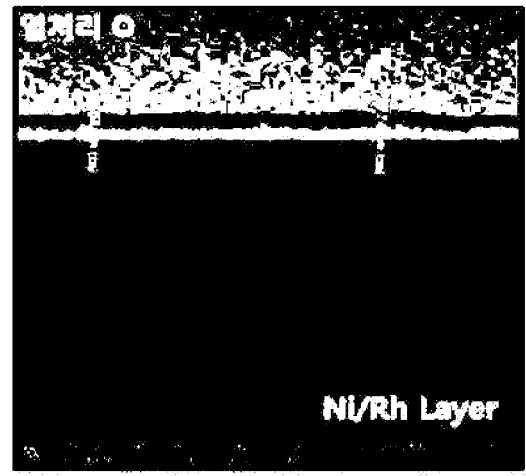
FIG. 10B is a cross-sectional SEM image showing an interface after depositing Ni/Au on a p-type contact layer and performing heat treatment.

FIGS. 10A and 10B are cross-sectional SEM images showing an interface after depositing Ni/Au and Ni/Rh on a p-type contact layer and performing heat treatment, respectively.

As shown in FIG. 10A, when Ni/Au was used, a large number of voids were observed after an annealing process, and a thickness of the Ni/Au layer was non-uniform. On the contrary, as shown in FIG. 10B, when Ni/Rh was used, a thickness of an ohmic contact layer is substantially uniform even after the annealing process, and no voids are observed.

In addition, as a result of comparing a light emitting diode using Ni/Rh and a light emitting diode using Ni/Au as a p-ohmic contact layer in a same structured light emitting diode, the light emitting diode using the Ni/Rh showed a relatively small forward voltage (Vf), and showed an improvement in light output of about 6%.

Figure 11A:
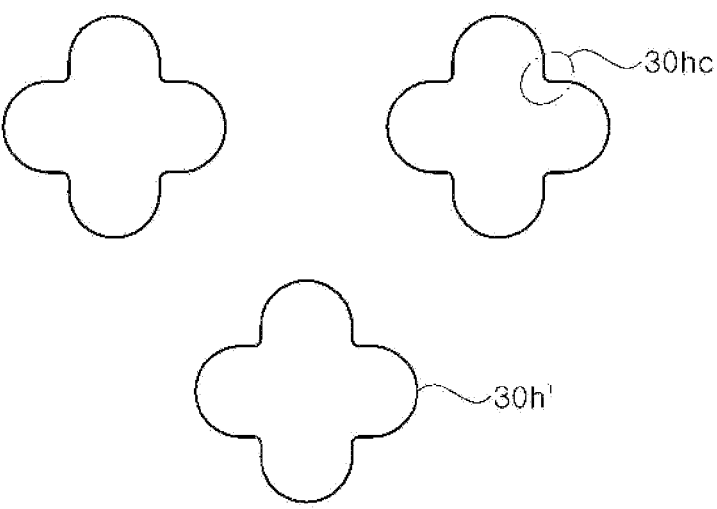
FIGS. 11A, 11B, and 11C are schematic plan views illustrating modified examples of via hole shapes of UV light emitting diodes according to exemplary embodiments of the present disclosure.
Figure 11B:
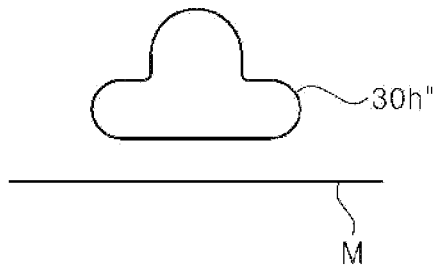
Figure 11C:
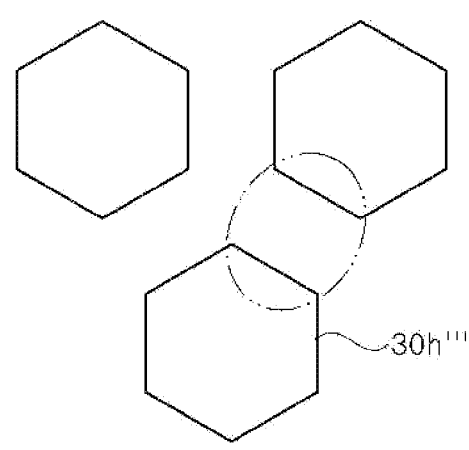

FIGS. 11A, 11B, and 11C are schematic plan views illustrating modified examples of via hole shapes of UV light emitting diodes according to exemplary embodiments of the present disclosure.

In the above embodiments, the via hole 30h has been illustrated and described as having a circular shape, but the shape of the via hole is not limited to the circular shape. As shown in FIG. 11A, a via hole 30h' may have a cross shape modified by forming depressions 30hc in the circular shape. The depressions 30hc may be formed in four parts at equal intervals, but the inventive concepts are not limited thereto. The via holes 30h' may be disposed such that a convex portion of one via hole 30h' faces between the depressions of two adjacent via holes 30h'. Furthermore, three via-holes 30h' may be disposed at vertices of equilateral triangles.

Meanwhile, as shown in FIG. 11B, a via hole 30h" disposed near an edge of a mesa M may have a shape modified from the cross shape. That is, the via hole 30h"

may include a linear portion parallel to the edge of the mesa M. The via hole 30h'' may be a region corresponding to ½ of the via hole 30h' shown in FIG. 11A. Accordingly, the via hole 30h'' may have only two depressions.

Meanwhile, as shown in FIG. 11C, a via hole 30h''' may have a polygonal shape. The via hole 30h''' may include a planar sidewall, and adjacent via holes 30h''' may face the planar sidewall as indicated by a dotted line.

Although via-holes of various shapes are shown and described in the illustrated exemplary embodiment, the inventive concepts are not limited to the shapes of these via-holes 30h, 30h', 30h'', and 30h''', and they may have other various shapes. The shape and the size of the via hole 30h affect the size of the ohmic contact region or the size of the light emitting region. Accordingly, the shape of the via hole 30h may be variously modified so as to adjust a magnitude of a radiation intensity.

Figure 12A:
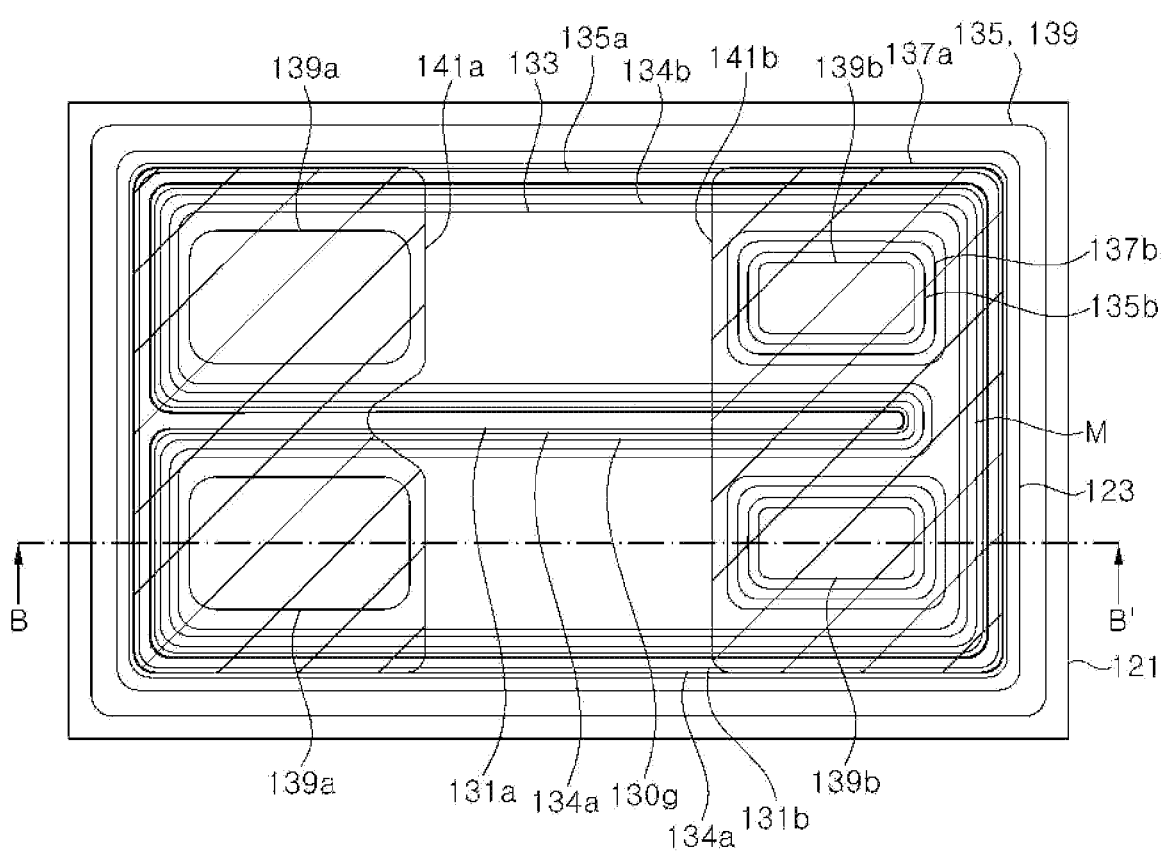
FIG. 12A is a schematic plan view illustrating a UV light emitting diode according to an exemplary embodiment of the present disclosure.
Figure 12B:
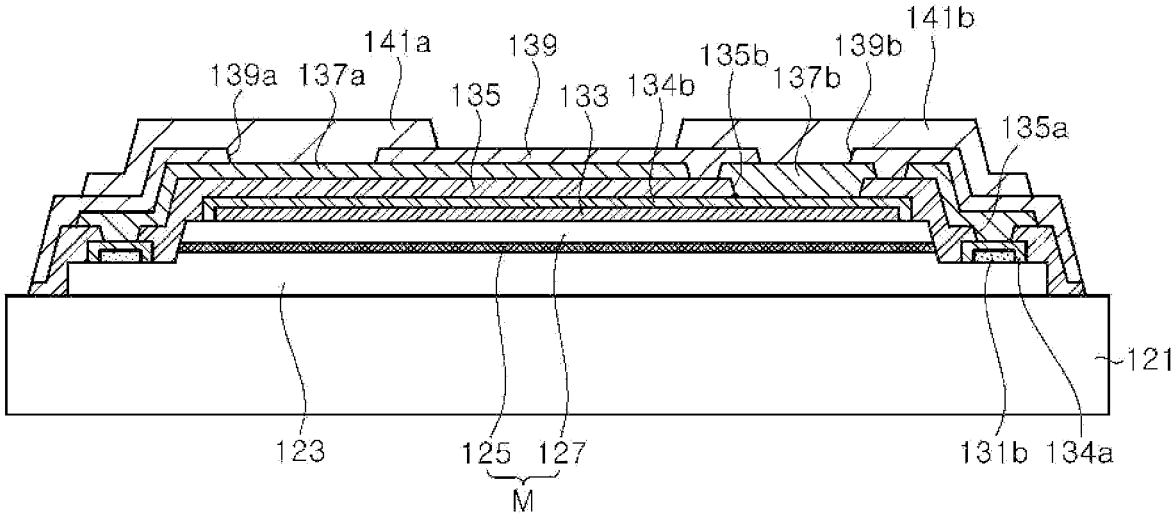
FIG. 12B is a schematic cross-sectional view taken along line B-B' of its corresponding plan view shown in FIG. 12A.

FIG. 12A is a schematic plan view illustrating a UV light emitting diode according to an exemplary embodiment of the present disclosure, and FIG. 12B is a schematic cross-sectional view taken along line B-B' of its corresponding plan view shown in FIG. 12A.

Referring to FIG. 12A and FIG. 12B, the UV light emitting diode according to the illustrated exemplary embodiment may include a substrate 121, an n-type semiconductor layer 123, an active layer 125, a p-type semiconductor layer 127, and n-ohmic contact layers 131a and 131b, a p-ohmic contact layer 133, an n-capping layer 134a, a p-capping layer 134b, a lower insulation layer 135, an n-pad metal layer 137a, a p-pad metal layer 137b, an upper insulation layer 139, an n-bump 141a, and a p-bump 141b.

Since the substrate 121 is similar to the substrate 21 described with reference to FIGS. 1A and 1, a detailed description thereof will be omitted to avoid redundancy. The n-type semiconductor layer 123 is disposed on the substrate 121. The n-type semiconductor layer 123 is substantially similar to the n-type semiconductor layer 23 described with reference to FIGS. 1A and 1B. However, edges of an n-type semiconductor layer 123 may be disposed inside a region surrounded by edges of the substrate 121, and thus, an upper surface of the substrate 121 may be exposed along the edges of the n-type semiconductor layer 123.

A mesa M is disposed on a partial region of the n-type semiconductor layer 123. The mesa M includes the active layer 125 and the p-type semiconductor layer 127. In general, the n-type semiconductor layer 123, the active layer 125, and the p-type semiconductor layer 127 are sequentially grown, and thereafter, the mesa M is formed by patterning the p-type semiconductor layer 127 and the active layer 125 through a mesa etching process.

Since a stacked structure of the active layer 125 and the p-type semiconductor layer 127 is similar to that described with reference to FIGS. 1A and 1, a detailed description thereof will be omitted to avoid redundancy.

The mesa M may have a rectangular external shape elongated in one direction, and includes a groove 130g exposing the n-type semiconductor layer 123. The groove 130g may extend along a longitudinal direction of the mesa M. As shown in FIG. 12A, the groove 130g may extend from one edge of the mesa M toward an opposite edge thereof along the longitudinal direction of the mesa M. A mesa region is disposed on both sides of the groove 130g by the groove 130g. A length of the groove 130g exceeds ½ of a length of the mesa M. In other words, the length of the groove 130g is greater than a distance between an inner end of the groove 130g and the opposite edge of the mesa M. Furthermore, the distance between the inner end of the groove 130g and the opposite edge of the mesa M may be smaller than a width of the mesa region disposed on both sides of the groove 130g.

The groove 130g may have a linear shape, and the mesa M may have a symmetrical structure with respect to a straight line passing through a center of the light emitting diode and parallel to the groove 130g.

Meanwhile, corners of the mesa M may have curved shapes. The edge of the mesa M may include a straight region and curved regions disposed on both sides thereof. By forming the corners of the mesa M to be curved, it is possible to prevent light from being condensed at the corner portion and thereby being lost due to light absorption.

Meanwhile, the n-ohmic contact layer 131a is disposed on the n-type semiconductor layer 123 exposed by the groove 130g. The n-ohmic contact layer 131b is disposed on the n-type semiconductor layer 123 exposed along a perimeter of the mesa M. The n-ohmic contact layer 131a may be connected to the n-ohmic contact layer 131b, but the inventive concepts are not limited thereto. The n-ohmic contact layers 131a and 131b may be spaced apart from the mesa M to surround the mesa M.

Materials and methods of forming the n-ohmic contact layers 131a and 131b are similar to those of forming the n-ohmic contact layers 31 described with reference to FIGS. 1A and 1B, and thus, detailed descriptions thereof will be omitted to avoid redundancy.

The p-ohmic contact layer 133 is disposed on the p-type semiconductor layer 127 to be in ohmic contact with the p-type semiconductor layer 127. The p-ohmic contact layer 133 may be formed using, for example, Ni/Rh or Ni/Au. The p-ohmic contact layer 133 is in ohmic contact with the p-type semiconductor layer 127 and covers most of a region over the mesa M, for example, 80% or more.

The n-capping layer 134a may cover upper surfaces and side surfaces of the n-ohmic contact layers 131a and 131b. The p-capping layer 134b may cover the upper surfaces and side surfaces of the p-ohmic contact layer 133. The n-capping layer 134a and the p-capping layer 134b prevent the n-ohmic contact layers 131a and 131b and the p-ohmic contact layer 133 from being damaged by etching, oxidation, or the like, respectively. The n-capping layer 134a and the p-capping layer 134b may be formed of a same metal in a same process. For example, the n-capping layer 134a and the p-capping layer 134b may be formed of Ti/Au/Ti.

The lower insulation layer 135 covers the mesa M, and covers the n-capping layer 134a and the p-capping layer 134b. The lower insulation layer 135 also covers the n-type semiconductor layer 123 exposed around the mesa M and in the groove 130g. Furthermore, the lower insulation layer 135 may cover a portion of the substrate 121 exposed around the n-type semiconductor layer 123. Meanwhile, the lower insulation layer 135 has openings 135a for allowing electrical connection to the n-ohmic contact layers 131a and 131b and openings 135b for allowing electrical connection to the p-ohmic contact layer 133. The opening 135a may have a shape similar to those of the n-ohmic contact layers 131a and 131b or the n-capping layer 134a. That is, the opening 135a surrounds the mesa M and also extends into the groove 130g. A width of the opening 135a may be smaller than that of the n-capping layer 134a, and thus, the n-type semiconductor layer 123 may not be exposed through the opening 135a. Meanwhile, the opening 135b is disposed in the region over the mesa M, and exposes the p-capping layer 134b. A plurality of openings 135b may be disposed on the p-capping layer 134b. In particular, the openings may be symmetrically disposed on both sides of the groove 130g.

The lower insulation layer 135 may be formed of, for example, SiO2, without being limited thereto, and may be formed as a distributed Bragg reflector. In particular, the lower insulation layer 135 may be formed so as to constitute an omni-directional reflector (ODR). For example, the lower insulation layer 135 may be formed of about 10,000 Å of SiO2.

Meanwhile, the n-pad metal layer 137a and the p-pad metal layer 137b are disposed on the lower insulation layer 135. The n-pad metal layer 137a and the p-pad metal layer 137b may be formed together in a same process with a same metal layer and disposed on a same level, that is, on the lower insulation layer 135. The n and p-pad metal layers 137a and 137b may include, for example, an Al layer.

The n-pad metal layer 137a is electrically connected to the n-ohmic contact layers 131a and 131b through the opening 135a of the lower insulation layer 135. The n-pad metal layer 137a may directly contact the n-capping layer 134a through the opening 135a of the lower insulation layer 135. The n-pad metal layer 137a may cover most region of the mesa M, and may also cover a region around the mesa M. The n-pad metal layer 137a may form the ODR together with the lower insulation layer 135.

Meanwhile, the p-pad metal layer 137b may be electrically connected to the p-ohmic contact layer 133 through the opening 135b of the lower insulation layer 135. The p-pad metal layers 137b may cover each of the openings 135b. Each of the p-pad metal layers 137b may be surrounded by the n-pad metal layer 137a. The p-pad metal layers 37b may be limited in the region over the mesa M. In the illustrated exemplary embodiment, all side surfaces of the mesa M are covered with the n-pad metal layer 137a. Accordingly, it is possible to prevent light loss from occurring at the side surfaces of the mesa M.

The upper insulation layer 139 covers the n-pad metal layer 137a and the p-pad metal layer 137b. However, the upper insulation layer 139 may have openings 139a exposing the n-pad metal layer 137a and openings 139b exposing the p-pad metal layer 137b. The opening 139a may expose the n-pad metal layer 137a near one edge of the mesa M, and the openings 139b may expose the p-pad metal layer 137b near the opposite edge of the mesa M. The openings 139a and 139b may be symmetrically disposed with respect to a line passing through the groove 130g, but the inventive concepts are not limited thereto.

The upper insulation layer 139 may be formed of, for example, silicon nitride or silicon oxide.

The n-bump 141a and the p-bump 141b are disposed on the upper insulation layer 139. The n-bump 141a covers the openings 139a and is connected to the n-pad metal layer 137a exposed through the openings 139a. The n-bump 141a is electrically connected to the n-type semiconductor layer 123 through the n-pad metal layer 137a and the n-ohmic contact layers 131a and 131b. The n-bump 141a and the p-bump 141b may partially cover the side surfaces of the mesa M.

The p-bump 141b covers the openings 139b and is connected to the p-pad metal layer 137b exposed through the openings 139b. The p-bump 141b is electrically connected to the p-type semiconductor layer 127 through the p-pad metal layer 137b and the p-ohmic contact layer 133.

The n-bump 141a and p-bump 141b may include Ti/Au, and may be formed of, for example, Ti/Au/Cr/Au or Ti/Ni/ Ti/Ni/TiNi/Ti/Au. As shown in FIG. 12A, the n-bump 141a and the p-bump 141b may be disposed opposite each other, and may occupy about ⅓ of an area of the mesa M, respectively. By making the areas of the n-bump 141a and the p-bump 141b relatively wide, heat generated in the light emitting diode may be easily dissipated, thereby improving a performance of the light emitting diode.

Furthermore, the openings 139a and 139b are covered by the n-bump 141a and the p-bump 141b, and thus, moisture or solder from the outside may be prevented from infiltrating into the openings 139a and 139b, thereby improving reliability.

Meanwhile, although not shown, an anti-reflection layer may be disposed on a light exiting surface of the substrate 121. The anti-reflection layer may be formed of a transparent insulation layer such as SiO2 to have a thickness that is an integer multiple of ¼ of a wavelength of ultraviolet rays, for example. Alternatively, a bandpass filter in which layers having different refractive indices are repeatedly stacked may be used as the anti-reflection layer.

FIGS. 13A, 14A, 15A, 16A, 17A, 18A, 19A, and 20A are schematic plan views illustrating a method of manufacturing a UV light emitting diode according to an exemplary embodiment of the present disclosure, and FIGS. 13B, 14B, 15B, 16B, 17B, 18B, 19B, and 20B are schematic cross-sectional views taken along line A-A' of their corresponding plan views shown in FIGS. 13A, 14A, 15A, 16A, 17A, 18A, 19A, and 20A, respectively.

Figure 13A:
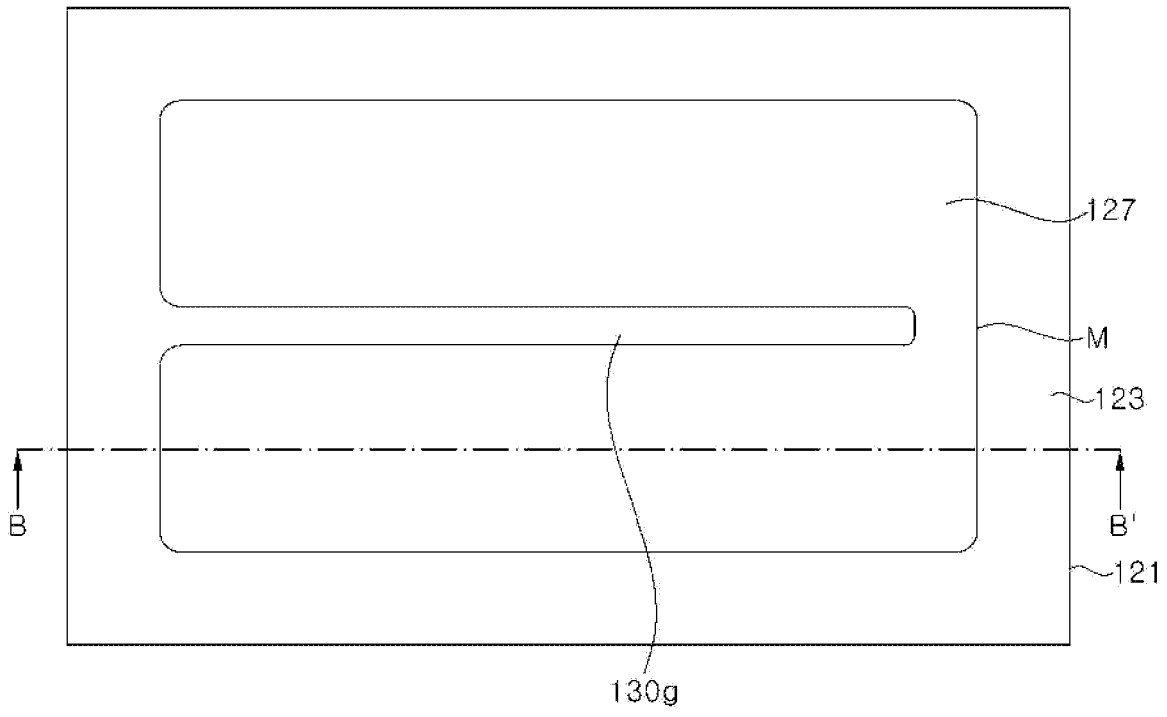
FIGS. 13A, 14A, 15A, 16A, 17A, 18A, 19A, and 20A are schematic plan views illustrating a method of manufacturing a UV light emitting diode according to an exemplary embodiment of the present disclosure.
Figure 13B:
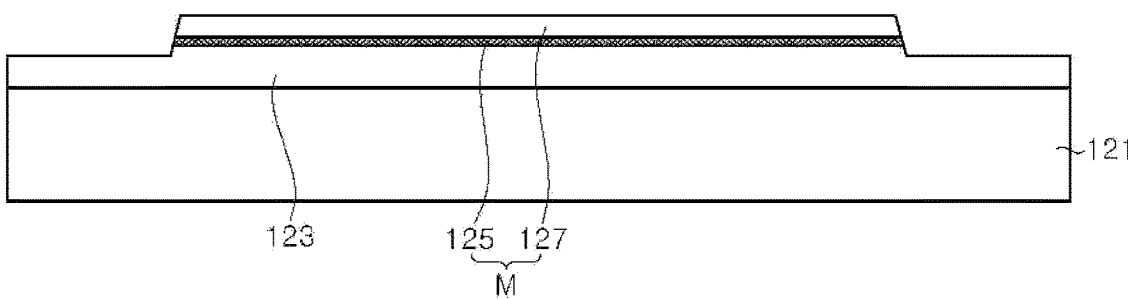
FIGS. 13B, 14B, 15B, 16B, 17B, 18B, 19B, and 20B are schematic cross-sectional views taken along line A-A' of their corresponding plan views shown in FIGS. 13A, 14A, 15A, 16A, 17A, 18A, 19A, and 20A, respectively.

Referring to FIG. 13A and FIG. 13B, first, an n-type semiconductor layer 123, an active layer 125, and an p-type semiconductor layer 127 are grown on a substrate 121.

Since the substrate 121, the n-type semiconductor layer 123, the active layer 125, and the p-type semiconductor layer 127 are identical to those described above, detailed descriptions thereof will be omitted to avoid redundancy.

Meanwhile, a mesa M is formed by patterning the p-type semiconductor layer 127 and the active layer 125. The mesa M may have a generally elongated rectangular shape, but the inventive concepts are not limited to a specific shape. As the mesa M is formed, the n-type semiconductor layer 123 may be exposed along a perimeter of the mesa M. In addition, a groove 130g is formed in a mesa M region. The groove 130g may extend from one edge toward an opposite edge along a longitudinal direction of the mesa M. An inner end of the groove 130g may be disposed near the opposite edge. The mesa regions disposed on both sides of the groove 130g may be identical to one another, and a width of each of the mesa regions may be greater than or equal to a distance between the inner end of the groove 130g and the opposite edge of the mesa M.

Figure 14A:
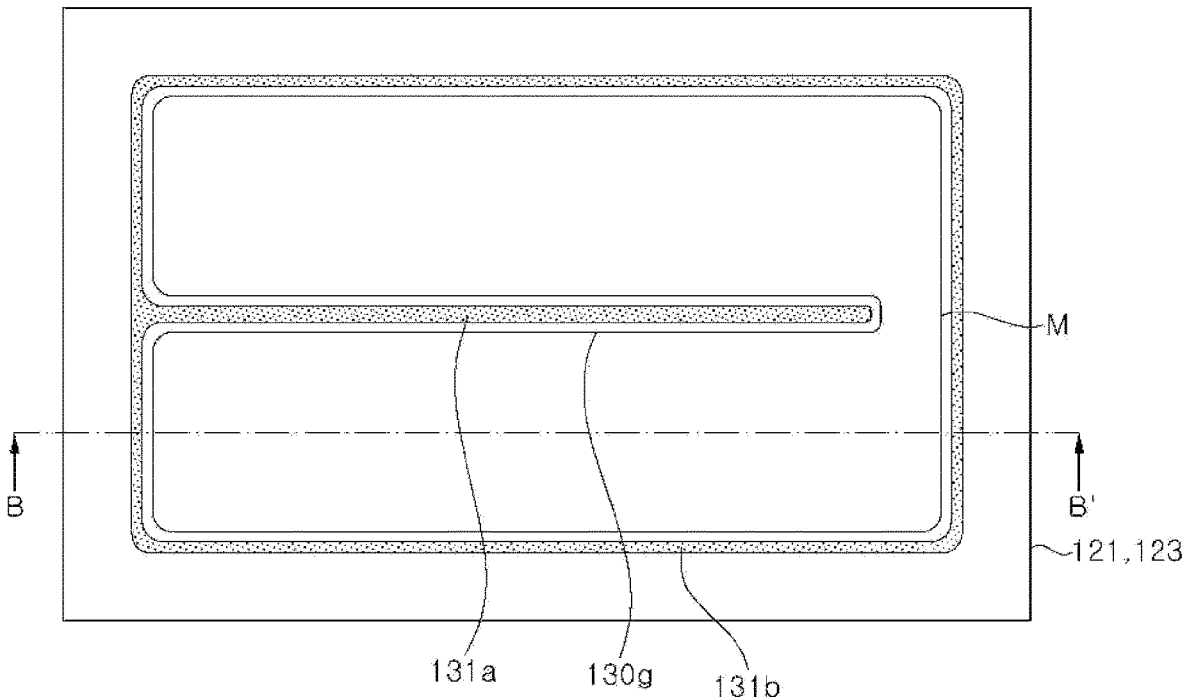
Figure 14B:
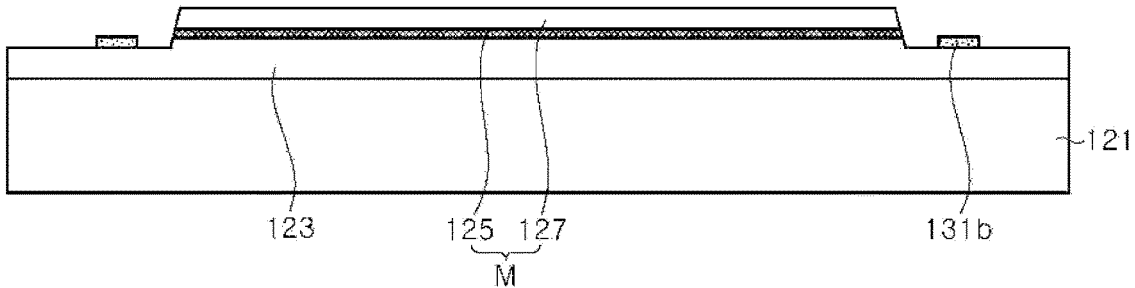

Referring to FIG. 14A and FIG. 14B, n-ohmic contact layers 131a and 131b are formed on the n-type semiconductor layer 123. The n-ohmic contact layers 131a and 131b may be formed by, for example, sequentially depositing Cr/Ti/Al/Ti/Au, and thereafter being alloyed using an RTA process. For example, the n-ohmic contact layers 131a and 131b may be alloyed through the RTA process at about 965° C. for 30 seconds. The n-ohmic contact layer 131a is formed on the n-type semiconductor layer 123 exposed by the groove 130g, and the n-ohmic contact layer 131b is formed on the n-type semiconductor layer 123 exposed around the mesa M. The n-ohmic contact layer 131a may extend from the n-ohmic contact layer 131b. By continuously forming the n-ohmic contact layer 131a and the n-ohmic contact layer 131b, current spreading may be assisted. However, the inventive concepts are not limited thereto, and the n-ohmic contact layer 131a may be spaced apart from the n-ohmic contact layer 131b.

Figure 15A:
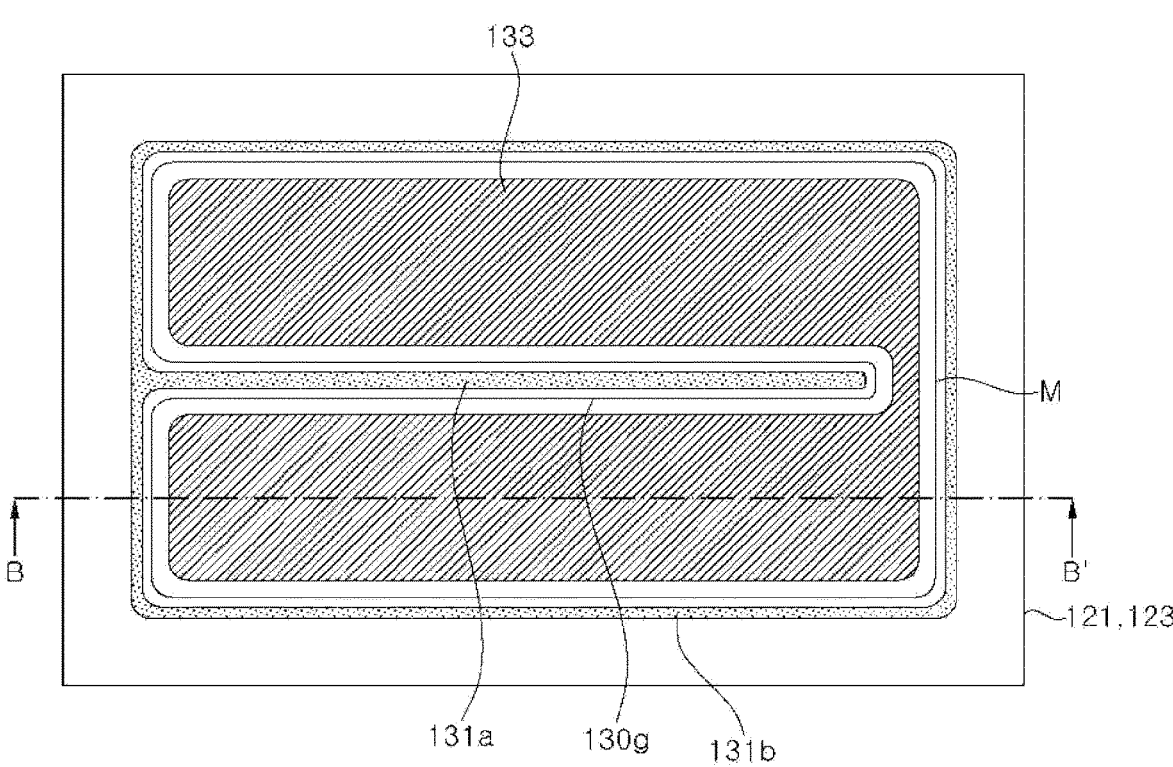
Figure 15B:
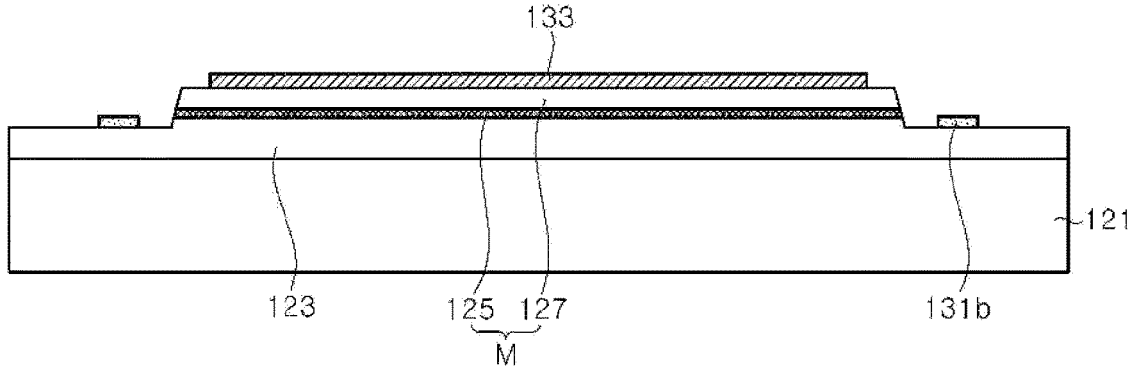

Referring to FIG. 15A and FIG. 15B, after the n-ohmic contact layers 131a and 131b are formed, a p-ohmic contact layer 133 is formed on the mesa M. The p-ohmic contact layer 133 is in ohmic contact with the p-type semiconductor layer 127. In particular, the p-ohmic contact layer 133 may be in ohmic contact with a p-type GaN layer.

The p-ohmic contact layer 133 may include a reflection metal layer such as Au or Rh. For example, after depositing Ni/Au or Ni/Rh, it may be alloyed through the RTA process.

Figure 16A:
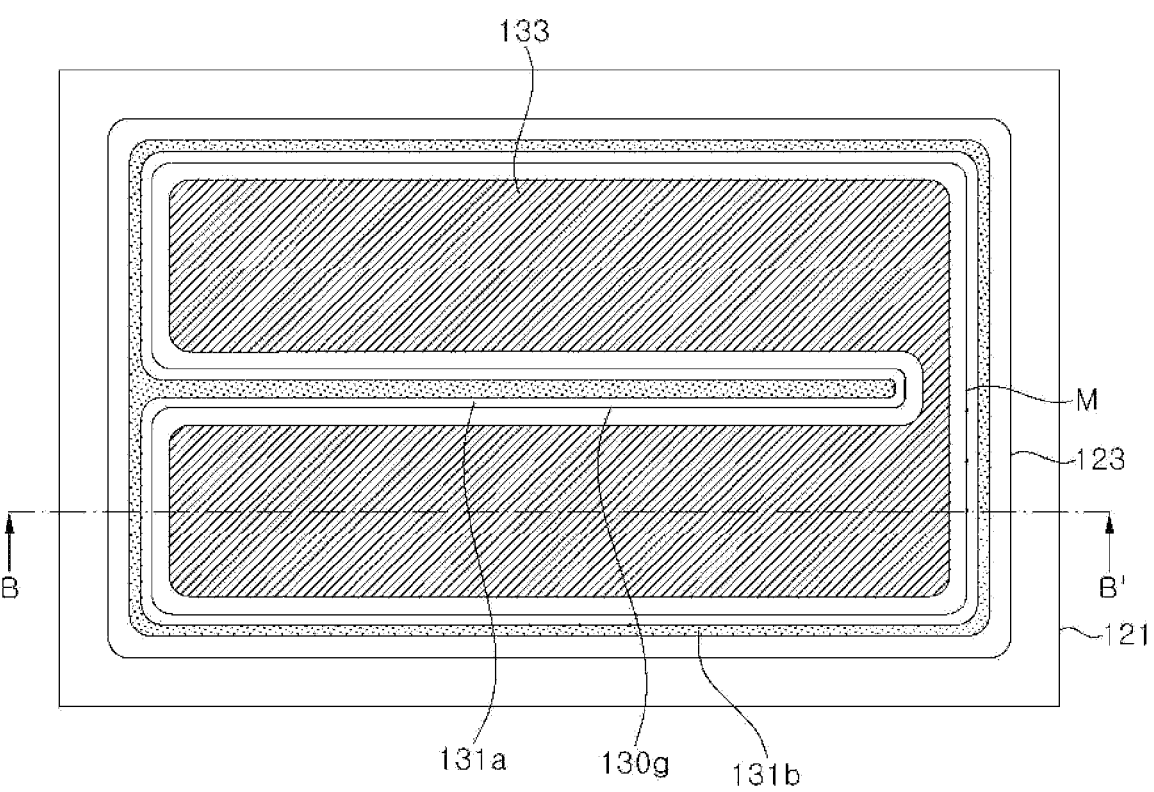
Figure 16B:
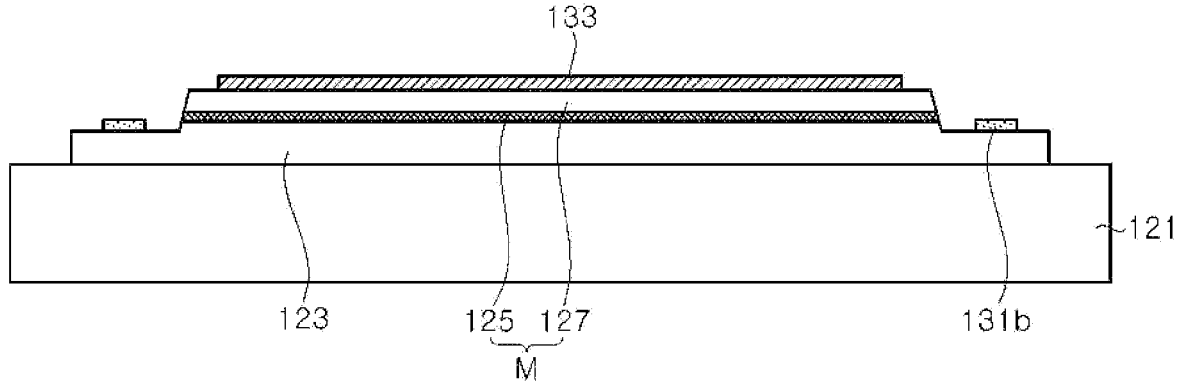

Referring to FIG. 16A and FIG. 16B, an isolation process for dividing the n-type semiconductor layer 123 is carried out. That is, the n-type semiconductor layer 123 between adjacent light emitting diode regions is removed to expose an upper surface of the substrate 121. By adding the isolation process, singularization of the light emitting diodes may be aided.

Figure 17A:
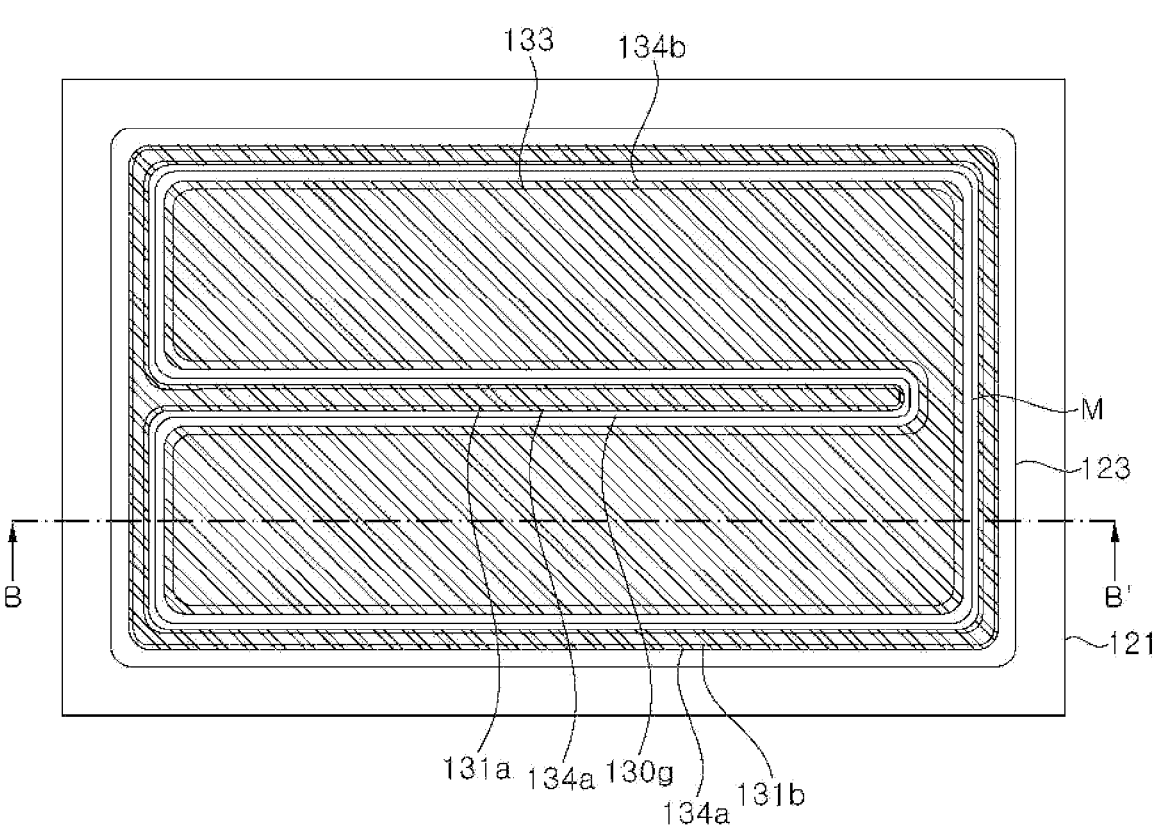
Figure 17B:
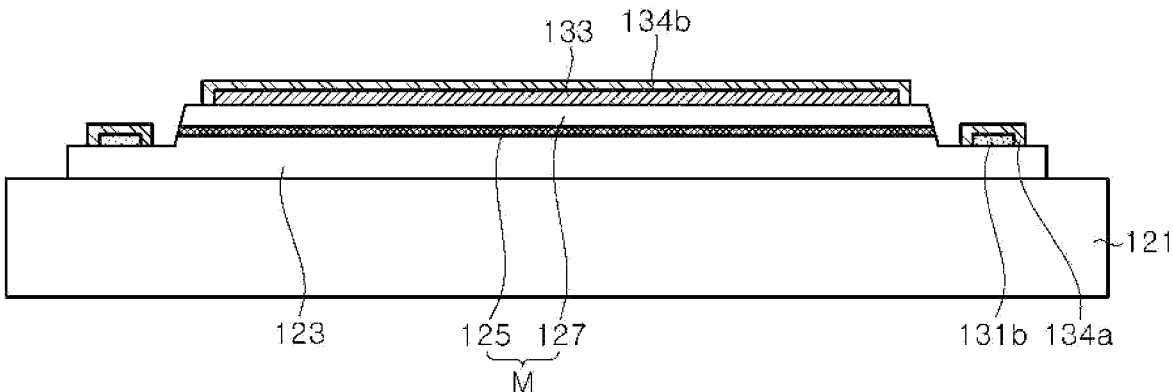

Referring to FIG. 17A and FIG. 17B, an n-capping layer 134a and a p-capping layer 134b are formed. The n-capping layer 134a covers upper surfaces and side surfaces of the n-type ohmic contact layers 131a and 131b, and the p-capping layer 134b covers upper and side surfaces of the p-type ohmic contact layer 133. The n-capping layer 134a and the p-capping layer 134b may be formed of, for example, Ti/Au/Ti.

Figure 18A:
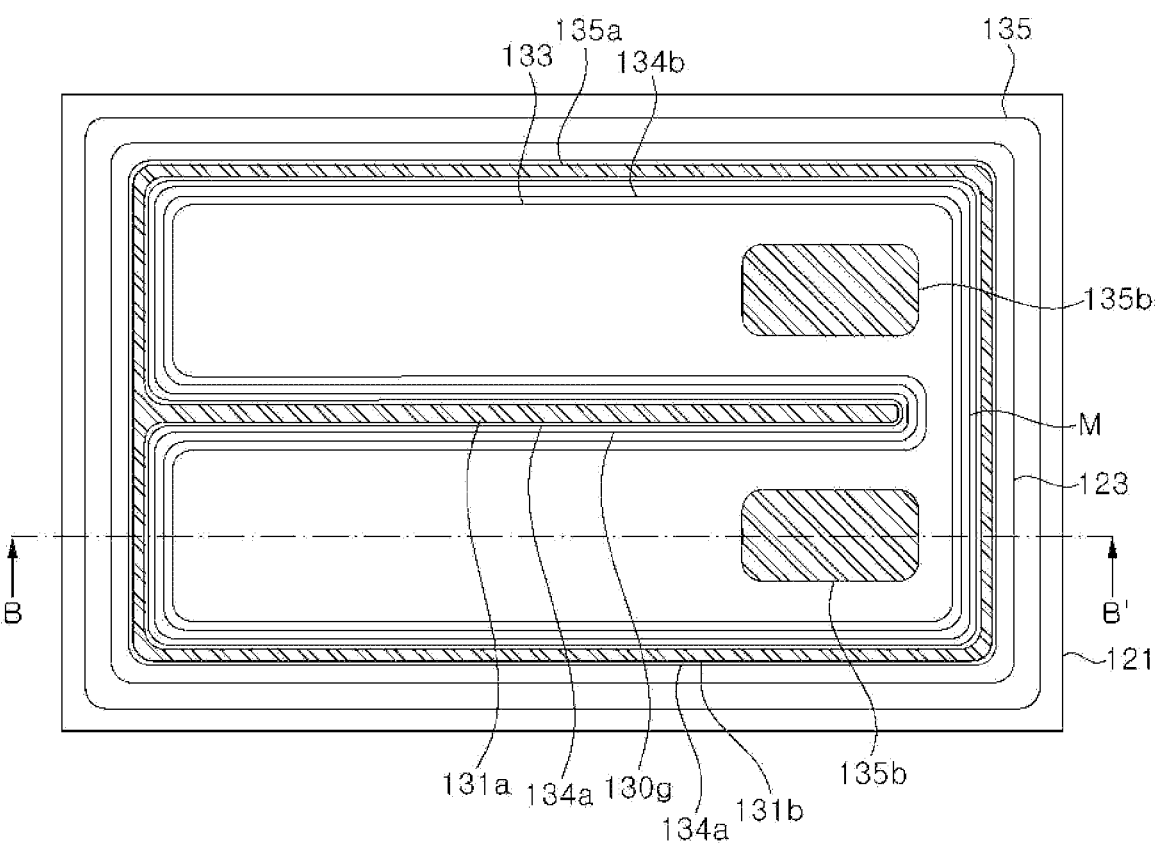
Figure 18B:
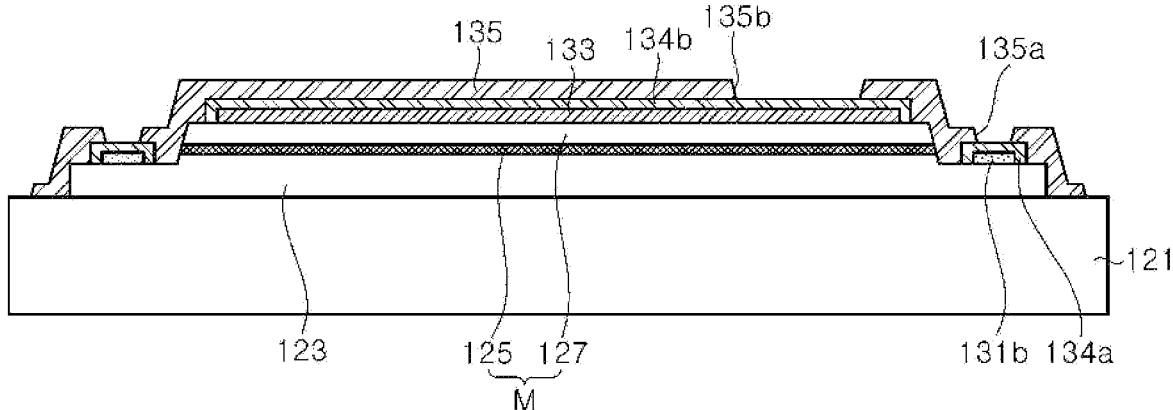

Referring to FIG. 18A and FIG. 18B, a lower insulation layer 135 covering the mesa M is formed. The lower insulation layer 135 covers side surfaces and an upper surface of the mesa M. The lower insulation layer 135 also covers the n-capping layer 134a and the p-capping layer 134b. The lower insulation layer 135 may cover a side surface of the n-type semiconductor layer 123, and may partially cover the substrate 121 exposed around the n-type semiconductor layer 123. Meanwhile, the lower insulation layer 135 has openings 135a and 135b exposing the n-capping layer 134a and the p-capping layer 134b.

The opening 135a of the lower insulation layer 135 exposes the n-capping layer 134a, and the opening 135b exposes the p-capping layer 134b. A plurality of openings 135b may be formed on the p-capping layer 134b. As illustrated, the openings 135b may be symmetrically disposed on both sides of the groove 130g.

Figure 19A:
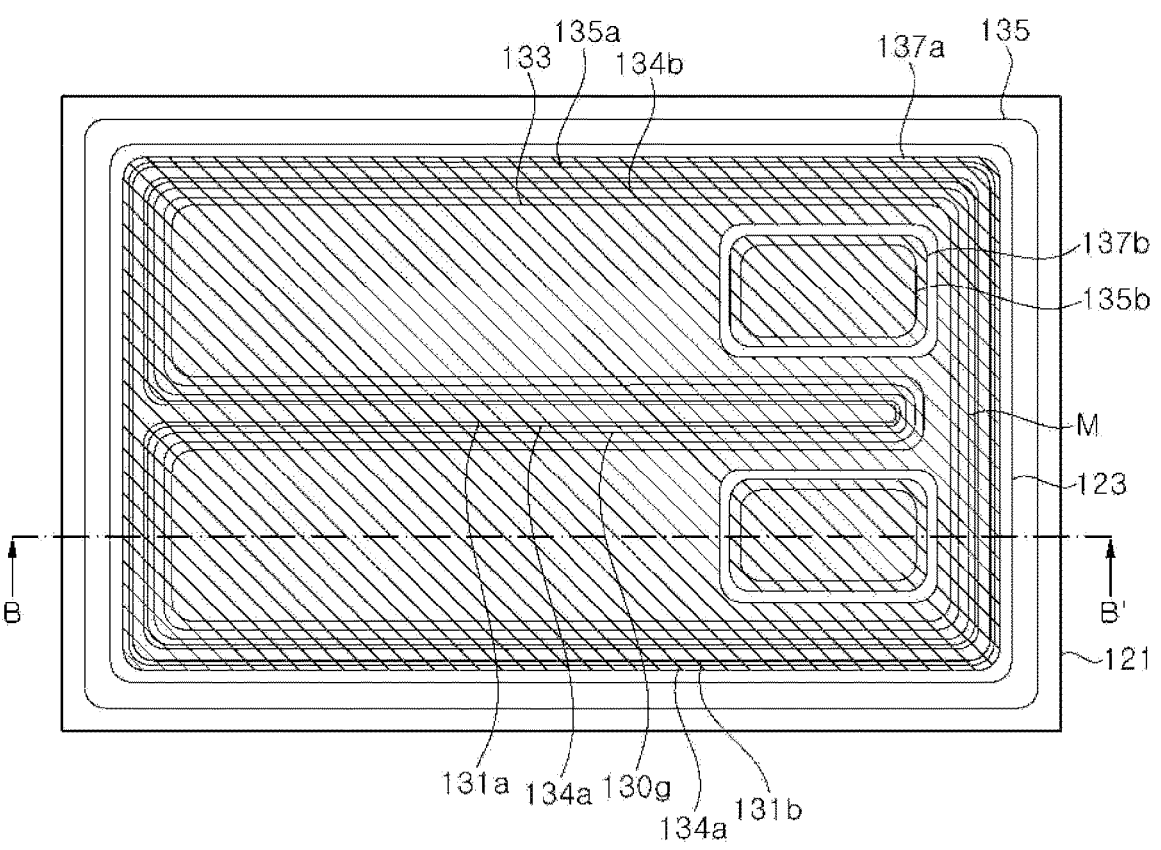
Figure 19B:
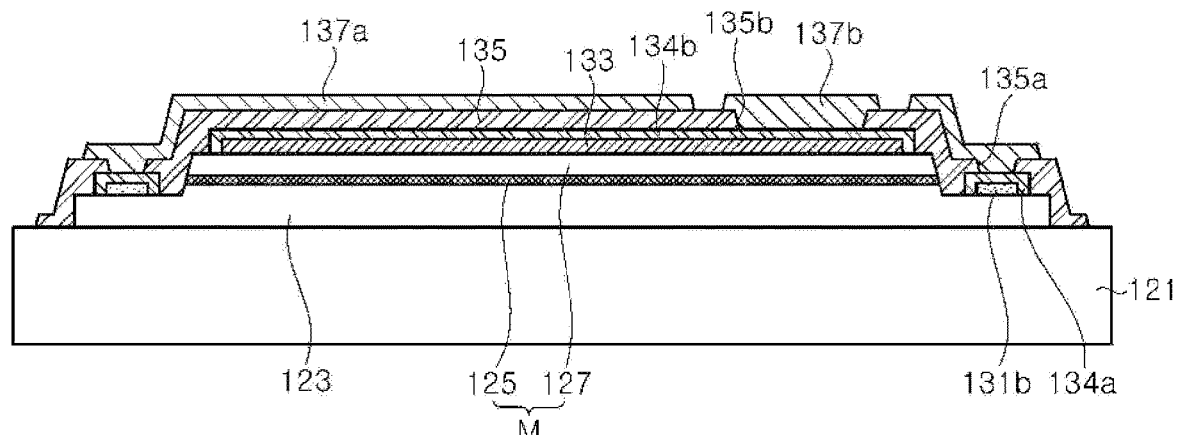

Referring to FIG. 19A and FIG. 19B, an n-pad metal layer 137a and a p-pad metal layer 137b are formed on the lower insulation layer 135. The n-pad metal layer 137a may be electrically connected to the n-capping layer 134a through the opening 135a, and the p-pad metal layer 137b may be electrically connected to the p-capping layer 134b through the opening 135b. As illustrated, the n-pad metal layer 137a may surround the p-pad metal layers 137b.

The n-pad metal layer 137a may cover the opening 135a, and the p-pad metal layer 137b may cover the opening 135b. In addition, the n-pad metal layer 137a may continuously cover the side surfaces of the mesa M, and thus, light reflectivity may be improved on the side surface of the mesa M.

Figure 20A:
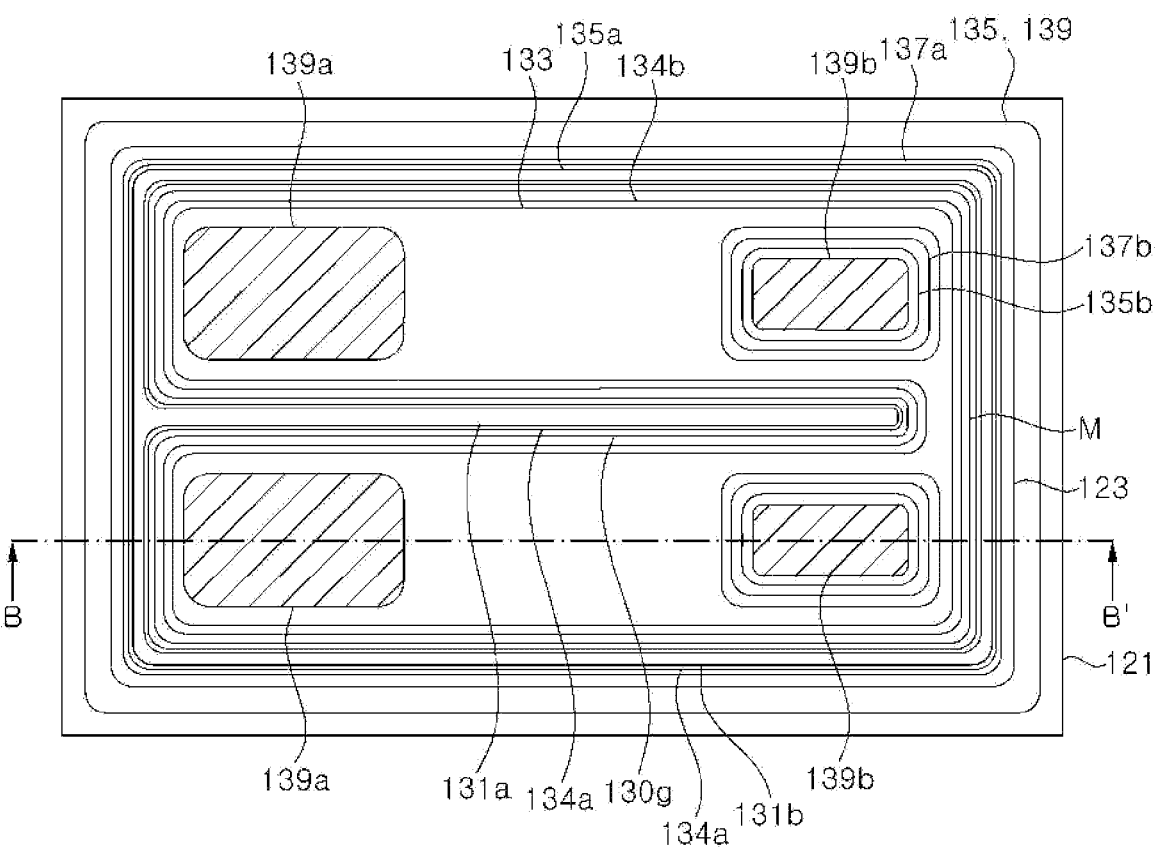
Figure 20B:
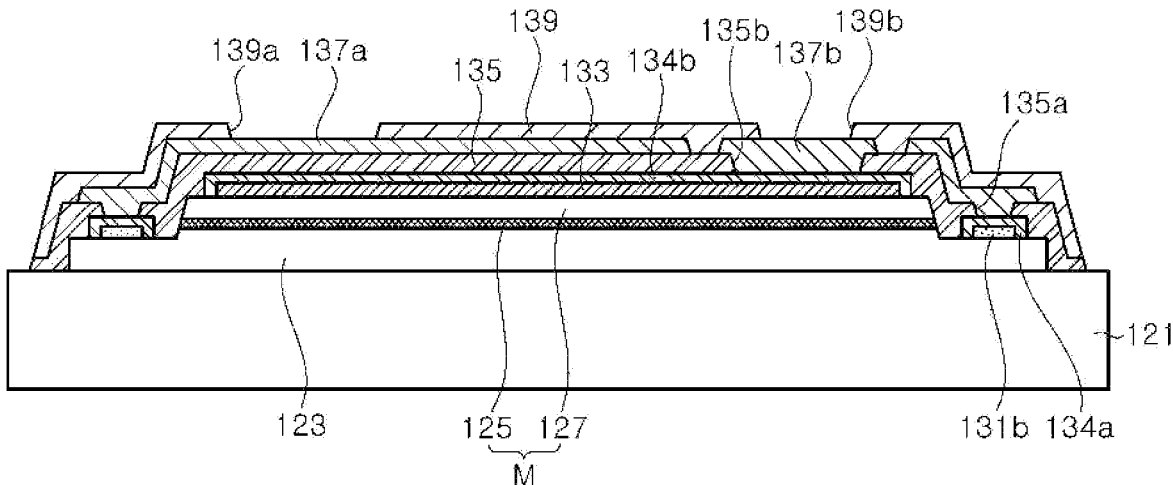

Referring to FIG. 20A and FIG. 20B, an upper insulation layer 139 is formed on the n-pad metal layer 137a and the p-pad metal layer 137b. The upper insulation layer 139 may cover the n-pad metal layer 137a and the p-pad metal layer 137b and may also cover an edge of the n-type semiconductor layer 123. The upper insulation layer 139 may also cover a portion of the upper surface of the substrate 121.

The upper insulation layer 139 has openings 139a and 139b exposing the n-pad metal layer 137a and the p-pad metal layer 137b. The openings 139a expose the n-pad metal layer 137a, and the openings 139b expose the p-pad metal layer 137b. The openings 139a may be formed near one edge of the mesa M, and the openings 139b may be formed near an opposite edge of the mesa M to face the openings 139a.

Subsequently, as shown in FIGS. 12A and 12B, an n-bump 141a and a p-bump 141b are formed on the upper insulation layer 139. The n-bump 141a is electrically connected to the n-pad metal layer 137a through the openings 139a, and the p-bump 141b is electrically connected to the p-pad metal layer 137b through the opening 139b.

The n-bump 141a and p-bump 141b may partially cover the side surface of the mesa M, respectively, but may be formed to be limited in a region over the mesa M.

According to the illustrated exemplary embodiment, by forming the groove 130g within the mesa M region and forming the n-ohmic contact layers 131a and 131b around the mesa M and in the groove 130g, current may be uniformly spread over an entire region of the mesa M.

Figure 21:
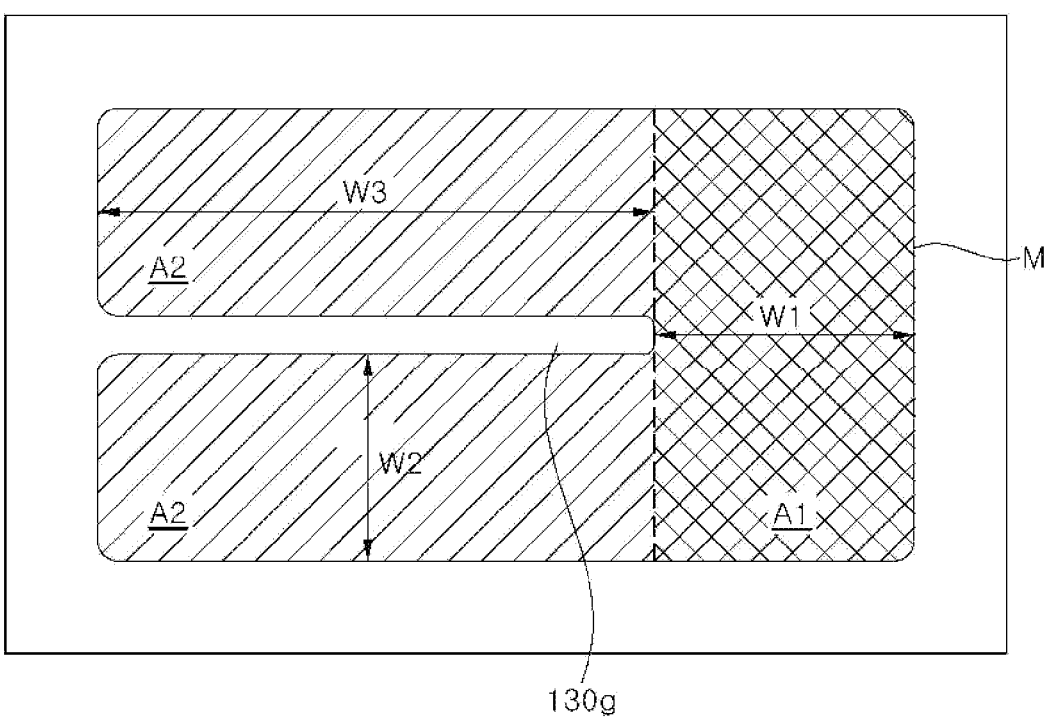
FIG. 21 is a schematic plan view illustrating a modified example of a mesa of a UV light emitting diode according to an exemplary embodiment of the present disclosure.

FIG. 21 is a schematic plan view illustrating a modified example of a mesa of a UV light emitting diode according to an exemplary embodiment of the present disclosure.

Referring to FIG. 21, a groove 130g extends from one edge of the mesa M toward an opposite edge in a longitudinal direction. A distance between an inner end of the groove 130g and the opposite edge of the mesa M, that is, a difference W1 between a total length of the mesa M and a length of the groove 130g may be less than or equal to a width W2 of each mesa region which is disposed on both sides of the groove 130g. Moreover, the length of the groove 130g is greater than W1, and thus, exceeds ½ of the length of the mesa M. Meanwhile, an area A1 of the mesa M between the groove 130g and the opposite edge of the mesa M may be smaller than an area A2 of each mesa region disposed on the both sides of the mesa M. That is, a total area 2A2 of the mesa regions disposed on the both sides of the mesa M may exceed ½ of a total area of the mesa.

Figure 22:
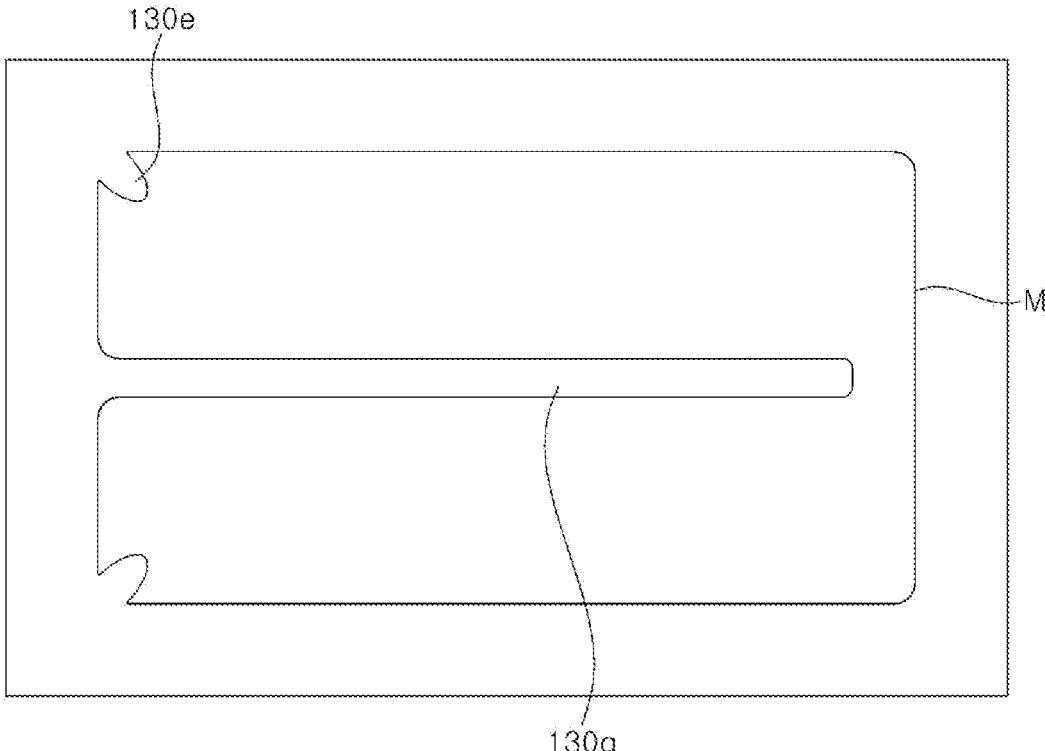
FIG. 22 is a schematic plan view illustrating another modified example of a mesa of a UV light emitting diode according to an exemplary embodiment of the present disclosure.

FIG. 22 is a schematic plan view illustrating another modified example of a mesa of a UV light emitting diode according to an exemplary embodiment of the present disclosure.

In the previous embodiments, the corners of the mesa M were shown and described as having the curved shape, but in this modified example, depressions may be formed in some corners among corners of the mesa M, respectively. The depressions improve p-side current spreading near the corners of the mesa M.

Figure 23A:
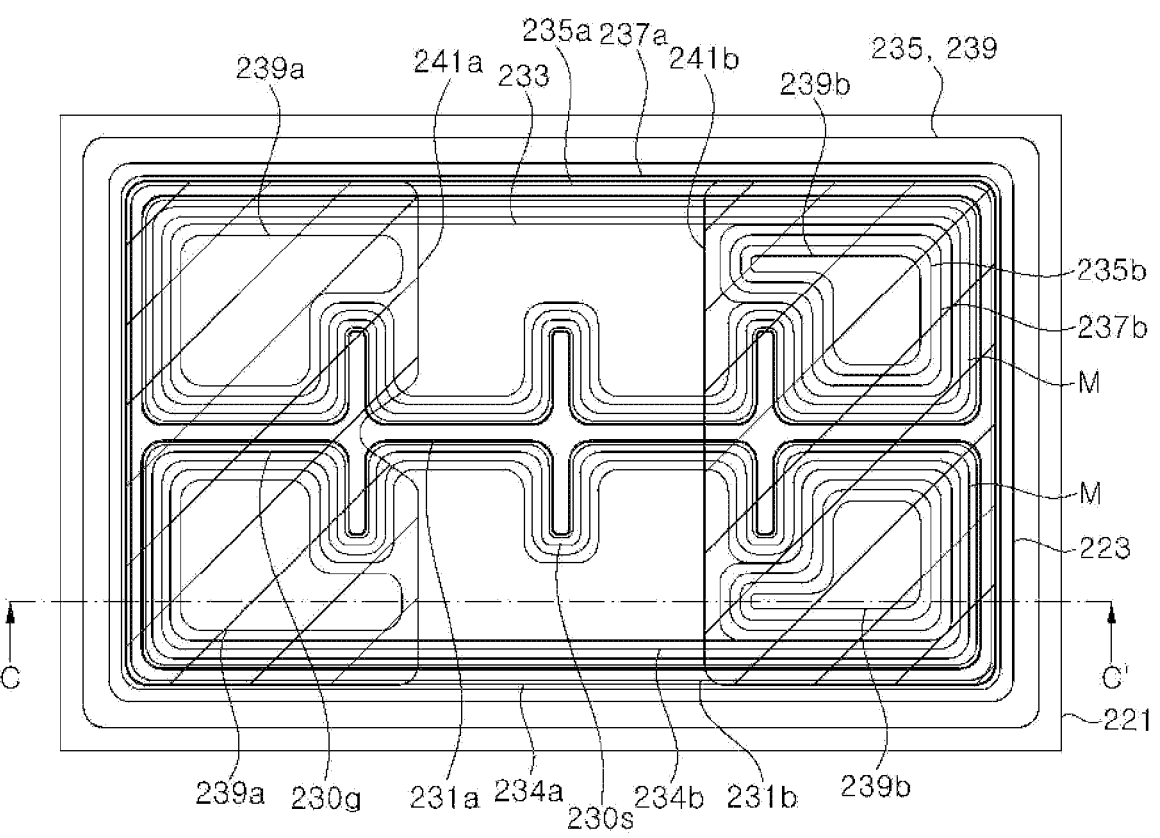
FIG. 23A is a schematic plan view illustrating a UV light emitting diode according to an exemplary embodiment of the present disclosure.
Figure 23B:
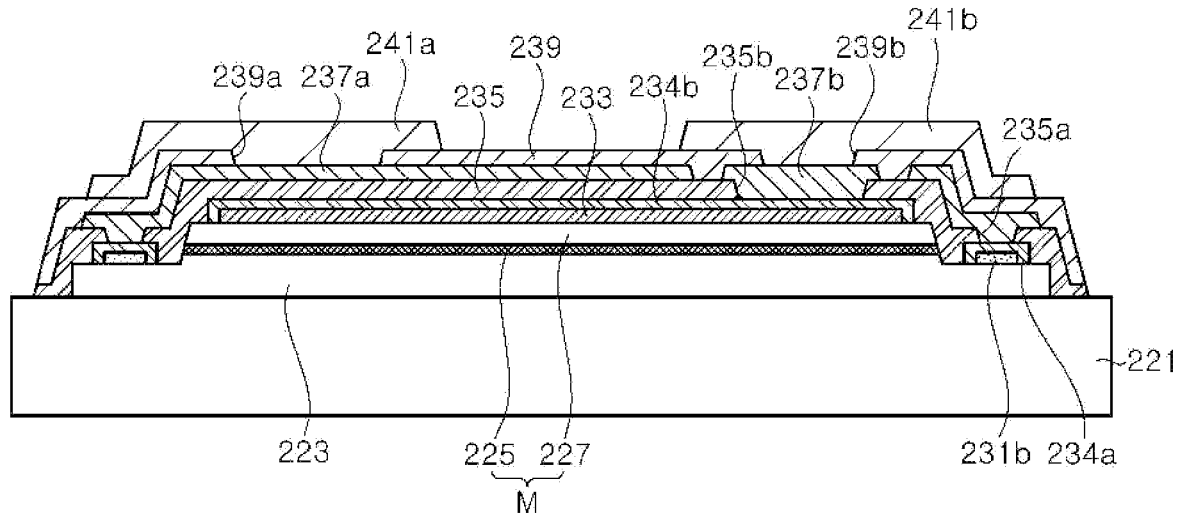
FIG. 23B is a schematic cross-sectional view taken along line C-C' in FIG. 23A.

FIG. 23A is a schematic plan view illustrating a UV light emitting diode according to an exemplary embodiment of the present disclosure, and FIG. 23B is a schematic cross-sectional view taken along line C-C' in FIG. 23A.

Referring to FIGS. 23A and 23B, the UV light emitting diode according to the illustrated exemplary embodiment may include a substrate 221, an n-type semiconductor layer 223, an active layer 225, a p-type semiconductor layer 227, and n-ohmic contact layers 231a and 231b, a p-ohmic contact layer 233, an n-capping layer 234a, a p-capping layer 234b, a lower insulation layer 235, an n-pad metal layer 237a, a p-pad metal layer 237b, an upper insulation layer 239, an n bumps 241a, and a p-bump 241b.

Since the UV light emitting diode according to the illustrated exemplary embodiment is generally similar to the UV light emitting diode described with reference to FIGS. 12A and 12B, detailed descriptions of same components will be omitted to avoid redundancy, and differences will be described in detail.

In the illustrated exemplary embodiment, a mesa M includes a main groove 230g and sub grooves 230s. The main groove 230g extends from one edge to an opposite edge along a longitudinal direction of the mesa M. The mesa M may be split into two by the main groove 230g. However, the inventive concepts are not limited thereto, and one end of the main groove 230g may be disposed inside the mesa M.

Meanwhile, the sub grooves 230s extend from the main groove 230g in a direction perpendicular to the main groove 230g. The sub grooves 230s may extend from the main groove 230g to both sides. The sub grooves 230s may be symmetrically disposed with respect to the main groove 230g.

Meanwhile, the n-ohmic contact layer 231a is disposed on the n-type semiconductor layer 223 exposed by the main groove 230g and the sub grooves 230s. The n-ohmic contact layer 231b is disposed on the n-type semiconductor layer 223 exposed along a periphery of the mesa M. The n-ohmic contact layer 231a may be connected to the n-ohmic contact layer 231b, but the inventive concepts are not limited thereto. The n-ohmic contact layers 231a and 231b may be spaced apart from the mesa M to surround the mesa M.

The p-ohmic contact layer 233 is disposed on the p-type semiconductor layer 227 to be in ohmic contact with the p-type semiconductor layer 227. The p-ohmic contact layer 233 may be disposed in a same shape on regions of the mesa that is split into two by the main groove 230g.

The n-capping layer 234a may cover upper surfaces and side surfaces of the n-ohmic contact layers 231a and 231b. The p-capping layer 234b may cover an upper and side surfaces of the p-ohmic contact layer 233.

The lower insulation layer 235 covers the mesa M, and covers the n-capping layer 234a and the p-capping layer 234b. The lower insulation layer 235 also covers the n-type semiconductor layer 223 exposed around the mesa M and in the grooves 230g and 230s. Furthermore, the lower insulation layer 235 may cover a portion of the substrate 221 exposed around the n-type semiconductor layer 223. Meanwhile, the lower insulation layer 235 has openings 235a for allowing electrical connection to the n-ohmic contact layers 231a and 231b and openings 235b for allowing electrical connection to the p-ohmic contact layer 233. The opening 235a may have a shape similar to that of the n-ohmic contact layers 231a and 231b or the n-capping layer 234a. That is, the opening 235a surrounds the mesa M and extends into the grooves 230g and 230s. A width of the opening 235a may be smaller than that of the n-capping layer 234a, and thus, the n-type semiconductor layer 223 may not be exposed through the opening 235a. Meanwhile, the opening 235b is disposed within an upper region of the mesa M, and exposes the p-capping layer 234b. A plurality of openings 235b may be disposed on the p-capping layer 234b. In particular, the openings 235b may be symmetrically disposed on both sides of the groove 230g.

Meanwhile, the n-pad metal layer 237a and the p-pad metal layer 237b are disposed on the lower insulation layer 135. The n-pad metal layer 237a and the p-pad metal layer 237b may be formed of a same metal layer in a same process and disposed on a same level, that is, on the lower insulation layer 235.

The n-pad metal layer 237a is electrically connected to the n-ohmic contact layers 231a and 231b through the opening 235a of the lower insulation layer 235. The n-pad metal layer 237a may directly contact the n-capping layer 234a through the opening 235a of the lower insulation layer 235. The n-pad metal layer 237a may cover most of the mesa M, and may also cover a region around the mesa M.

Meanwhile, the p-pad metal layer 237b may be electrically connected to the p-ohmic contact layer 233 through the opening 235b of the lower insulation layer 235. The p-pad metal layers 237b may cover each of the openings 235b. Each of the p-pad metal layers 237b may be surrounded by the n-pad metal layer 237a. The p-pad metal layers 237b may be disposed within the upper region of the mesa M. Shapes of the p-pad metal layers 237b may have different shapes from that of the p-pad metal layer 137b of FIG. 12A due to the sub-grooves 230s. That is, the p-pad metal layer 237b may have a rectangle shape in which a portion thereof is recessed so as to form the sub-groove 230s. In the illustrated exemplary embodiment, all side surfaces of the mesa M are covered with the n-pad metal layer 237a. Accordingly, it is possible to prevent light loss from occurring on the side surfaces of the mesa M.

The upper insulation layer 239 covers the n-pad metal layer 237a and the p-pad metal layer 237b, and may have openings 139a exposing the n-pad metal layer 137a and openings 139b exposing the p-pad metal layer 137b. The opening 239a may expose the n-pad metal layer 237a near the one edge of the mesa M, and the openings 239b may expose the p-pad metal layer 237b near the opposite edge of the mesa M. The openings 239a and 239b may be disposed symmetrically with respect to a line passing through the groove 230g, but the present disclosure is not necessarily limited thereto.

The n-bump 241a and the p-bump 241b are disposed on the upper insulation layer 239. The n-bumps 241a cover the openings 239a and are connected to the n-pad metal layer 237a exposed through the openings 239a. The p-bump 241b covers the openings 239b and is connected to the p-pad metal layer 237b exposed through the openings 239b.

FIGS. 24A, 25A, 26A, 27A, 28A, 29A, 30A, and 31A are schematic plan views illustrating a method of manufacturing a UV light emitting diode according to an exemplary embodiment of the present disclosure, and FIGS. 24B, 25B, 26B, 27B, 28B, 29B, 30B, and 31B are schematic cross-sectional views taken along line C-C' of their corresponding plan views shown in FIGS. 24A, 25A, 26A, 27A, 28A, 29A, 30A, and 31A, respectively. Since the method of manufacturing the UV light emitting diode according to the illustrated exemplary embodiment is substantially similar to that described above with reference to FIGS. 13A through 20B, it will be briefly described.

Figure 24A:
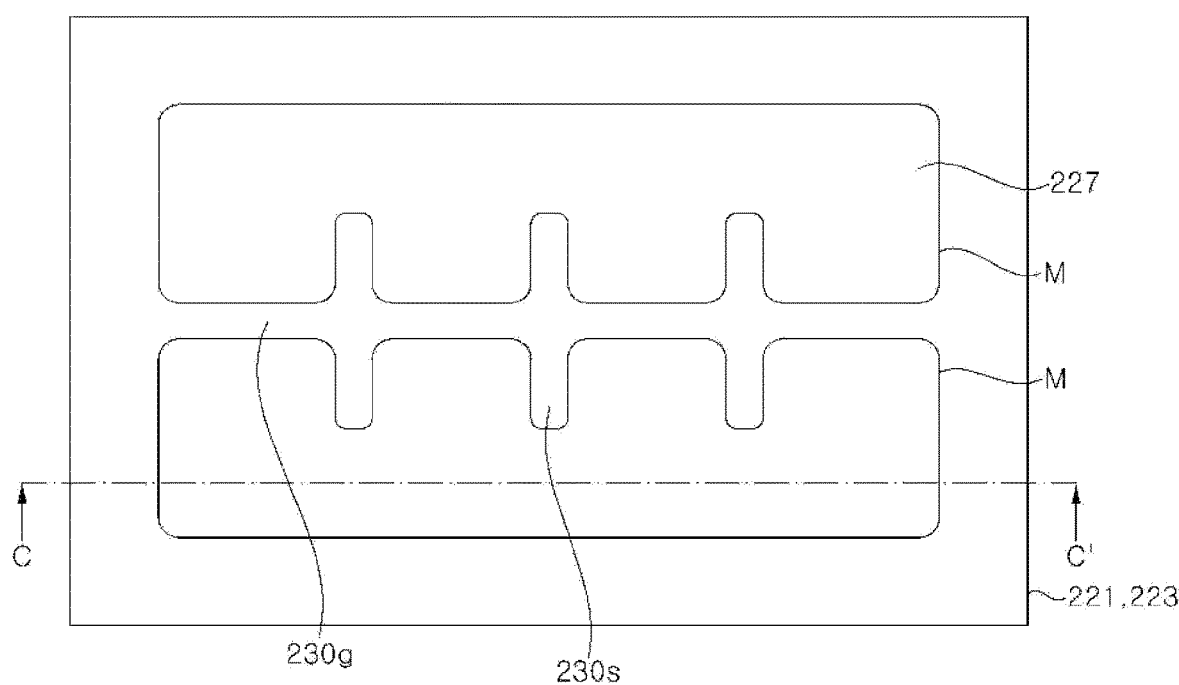
FIGS. 24A, 25A, 26A, 27A, 28A, 29A, 30A, and 31A are schematic plan views illustrating a method of manufacturing a UV light emitting diode according to an exemplary embodiment of the present disclosure.
Figure 24B:
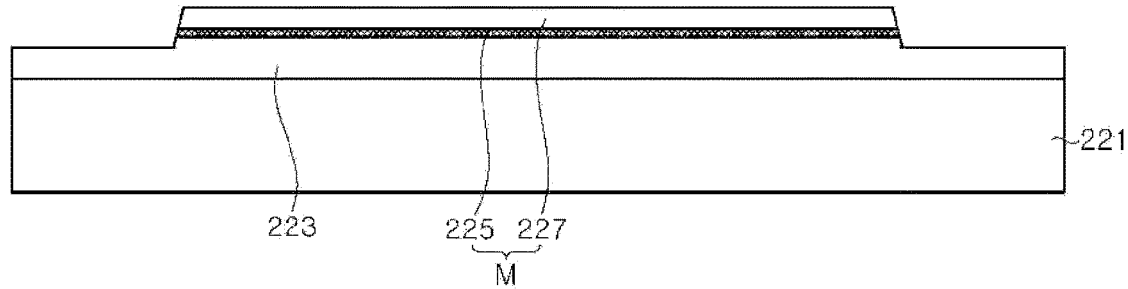
FIGS. 24B, 25B, 26B, 27B, 28B, 29B, 30B, and 31B are schematic cross-sectional views taken along line C-C' of their corresponding plan views shown in FIGS. 24A, 25A, 26A, 27A, 28A, 29A, 30A, and 31A, respectively.

Referring to FIGS. 24A and 24B, first, an n-type semiconductor layer 223, an active layer 225, and a p-type semiconductor layer 227 are grown on a substrate 221.

Meanwhile, a mesa M is formed by patterning the p-type semiconductor layer 227 and the active layer 225. The mesa M may have a generally elongated rectangular shape, but the inventive concepts are not limited to a specific shape. As the mesa M is formed, the n-type semiconductor layer 223 may be exposed along a perimeter of the mesa M. In addition, a main groove 230g and sub grooves 230s are formed in a mesa M region. The main groove 230g may extend from one edge to an opposite edge thereof along a longitudinal direction of the mesa M. Mesa regions disposed on both sides of the main groove 230g may be identical to one another, and may be symmetrical with respect to the main groove 230g.

Figure 25A:
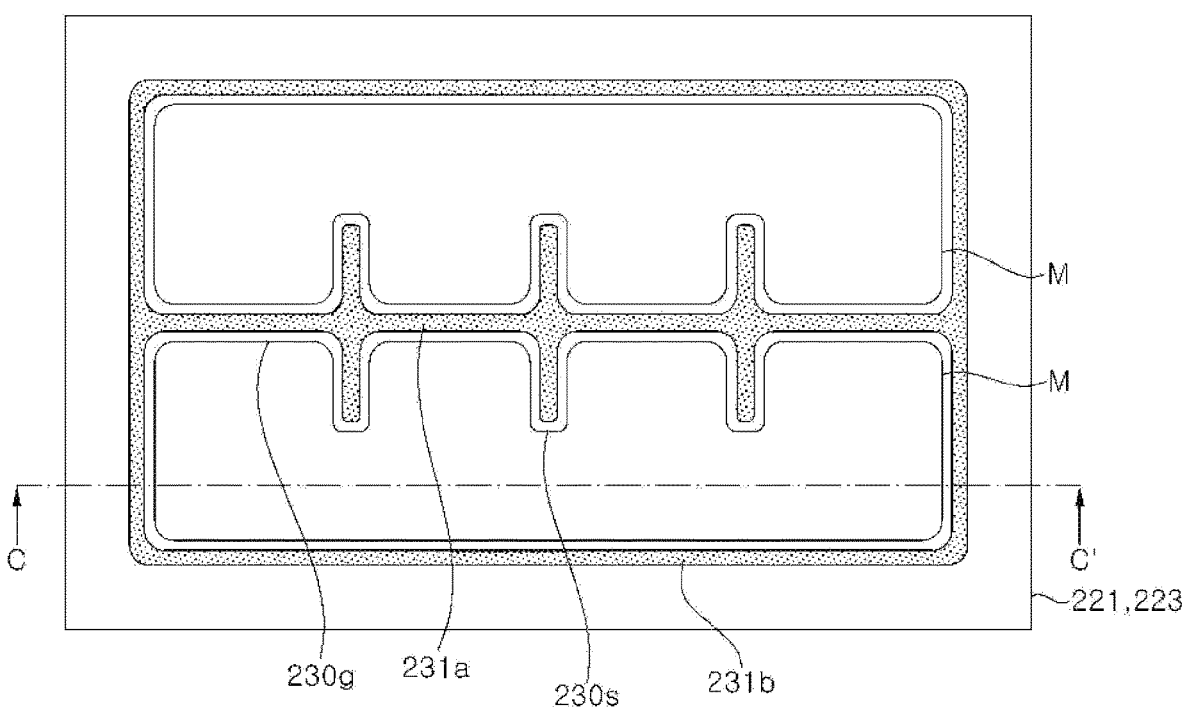
Figure 25B:
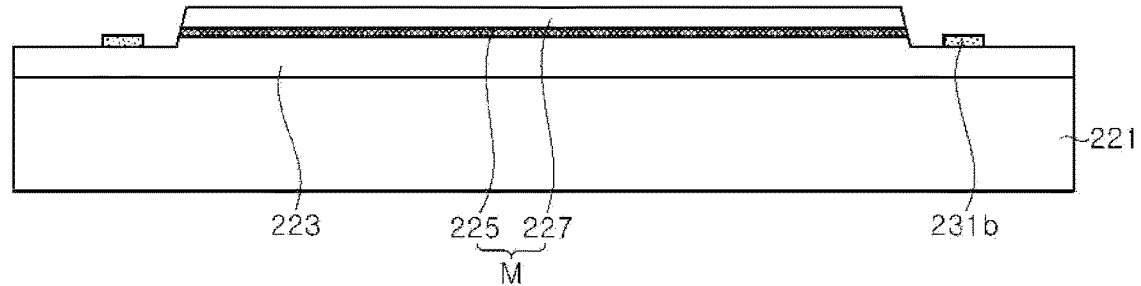

Referring to FIGS. 25A and 25B, n-ohmic contact layers 231a and 231b are formed on the n-type semiconductor layer 223. The n-ohmic contact layer 231a is formed on the n-type semiconductor layer 223 exposed by the main groove 230g and the sub-grooves 230s, and the n-ohmic contact layer 231b is formed on the n-type semiconductor layer 223 exposed around the mesa M. The n-ohmic contact layer 231a may extend from the n-ohmic contact layer 231b. By continuously forming the n-ohmic contact layer 231a and the n-ohmic contact layer 231b, current spreading may be assisted. However, the inventive concepts are not limited thereto, and the n-ohmic contact layer 231a may be spaced apart from the n-ohmic contact layer 231b.

Figure 26A:
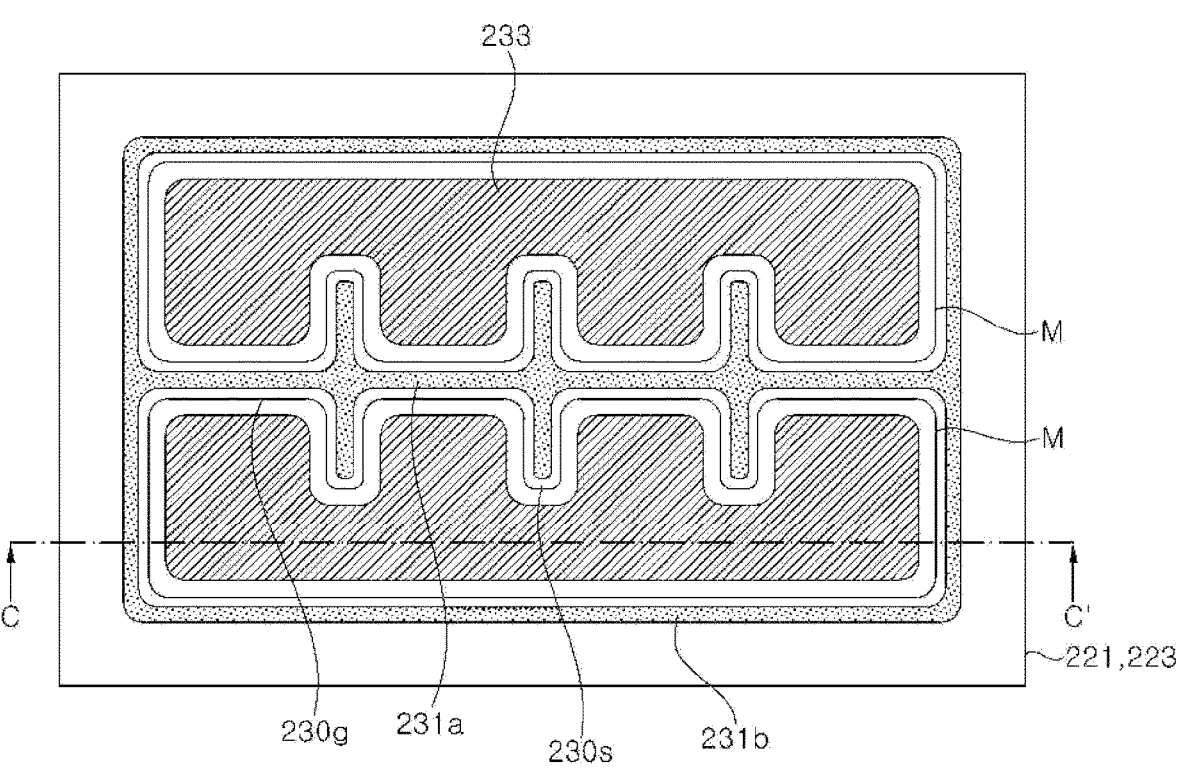
Figure 26B:
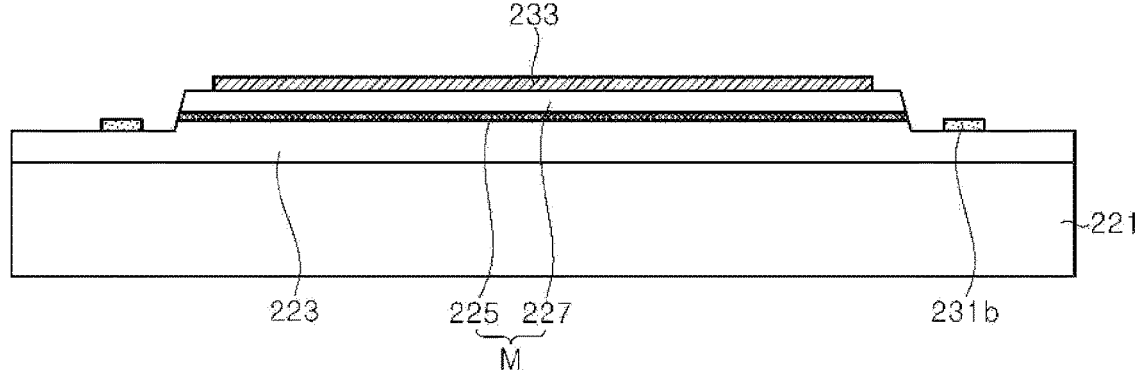

Referring to FIGS. 26A and 26B, after the n-ohmic contact layers 231a and 231b are formed, a p-ohmic contact layer 233 is formed on the mesa M. The p-ohmic contact layer 233 is in ohmic contact with the p-type semiconductor layer 227.

Figure 27A:
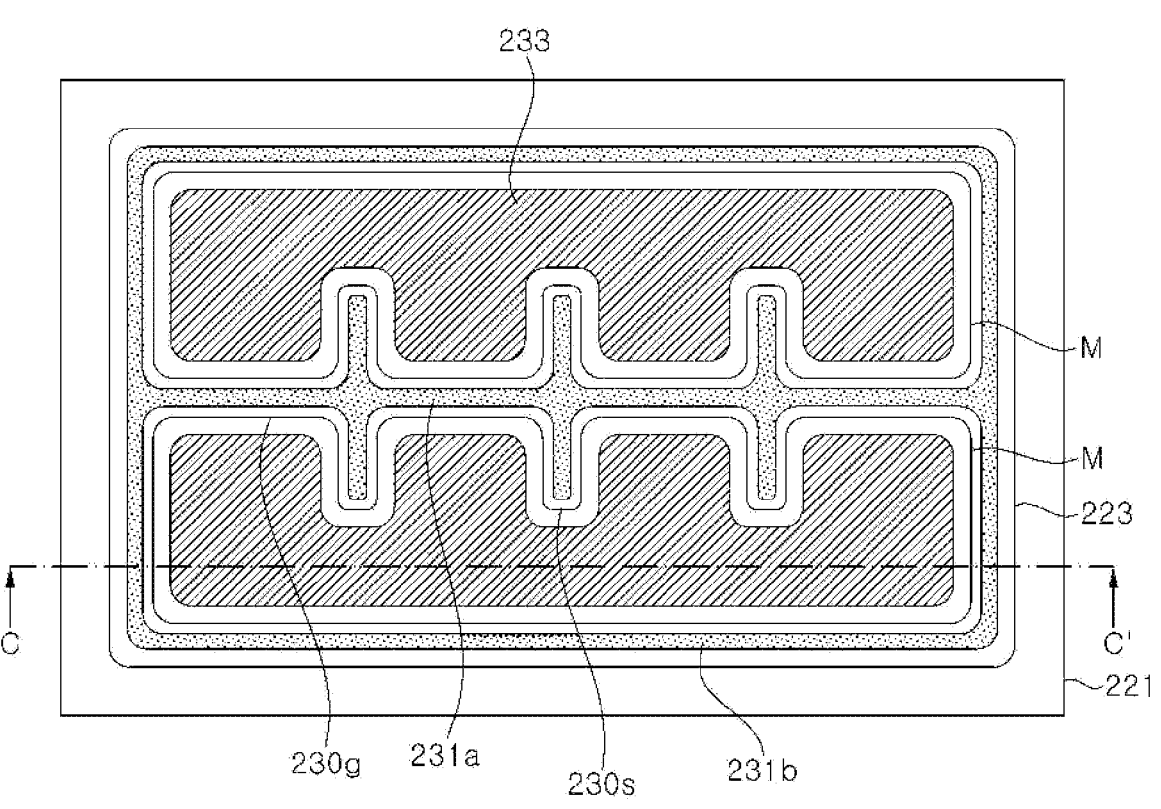
Figure 27B:
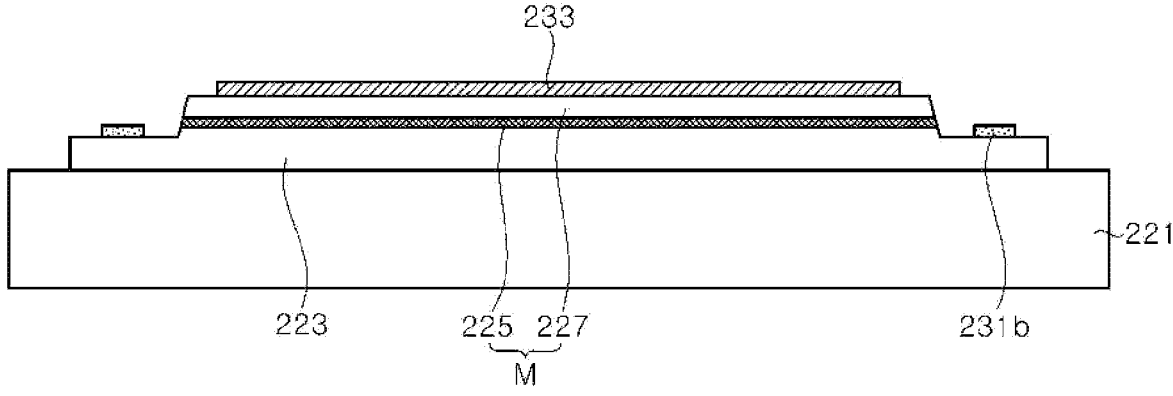

Referring to FIGS. 27A and 27B, an isolation process for dividing the n-type semiconductor layer 223 is carried out. That is, the n-type semiconductor layer 223 between adjacent light emitting diode regions is removed to expose an upper surface of the substrate 221. By adding the isolation process, singularization of the light emitting diodes may be assisted.

Figure 28A:
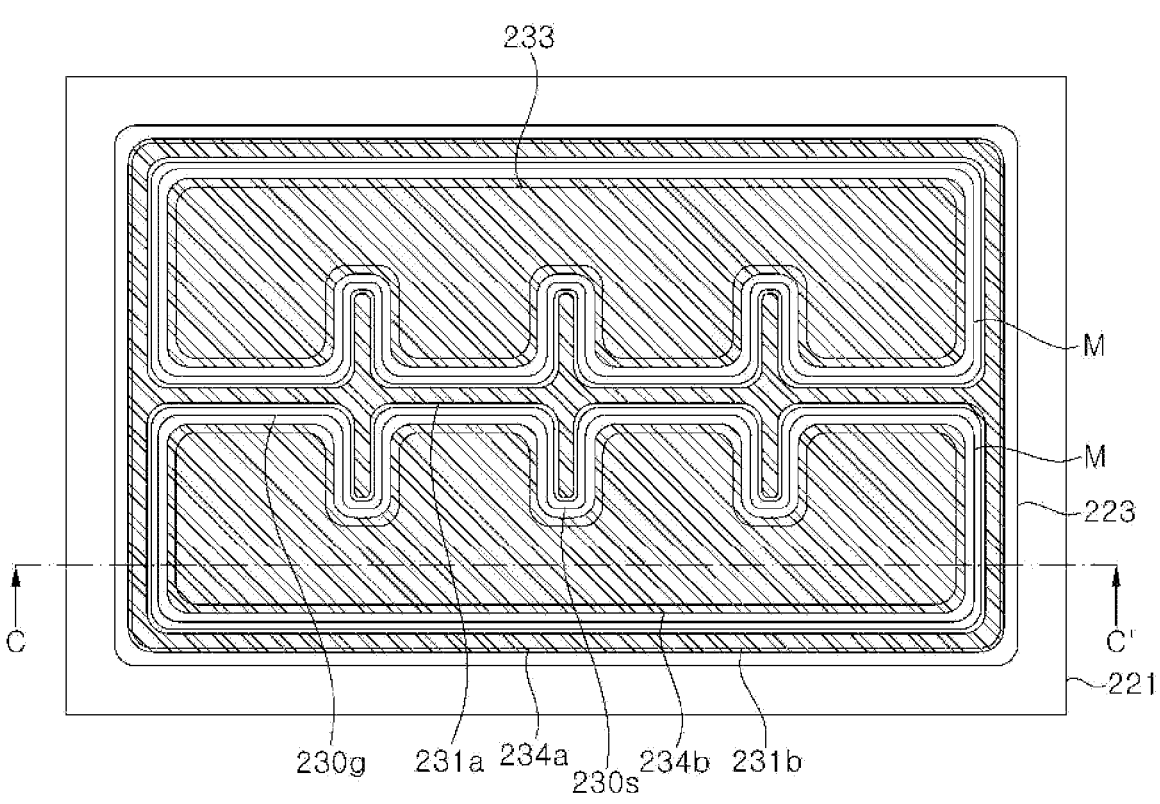
Figure 28B:
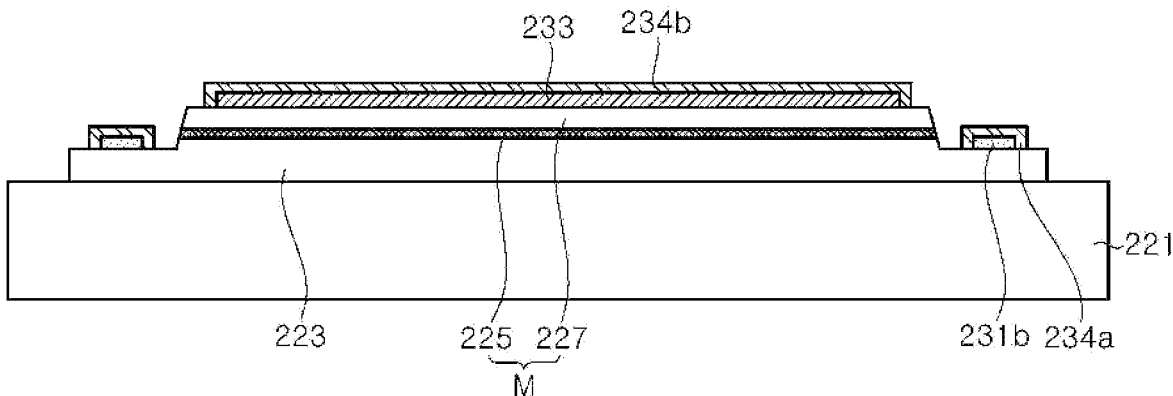

Referring to FIGS. 28A and 28B, an n-capping layer 234a and a p-capping layer 234b are formed. The n-capping layer 234a covers upper surfaces and side surfaces of the n-type ohmic contact layers 231a and 231b, and the p-capping layer 234b covers an upper surface and side surfaces of the p-type ohmic contact layer 233.

Figure 29A:
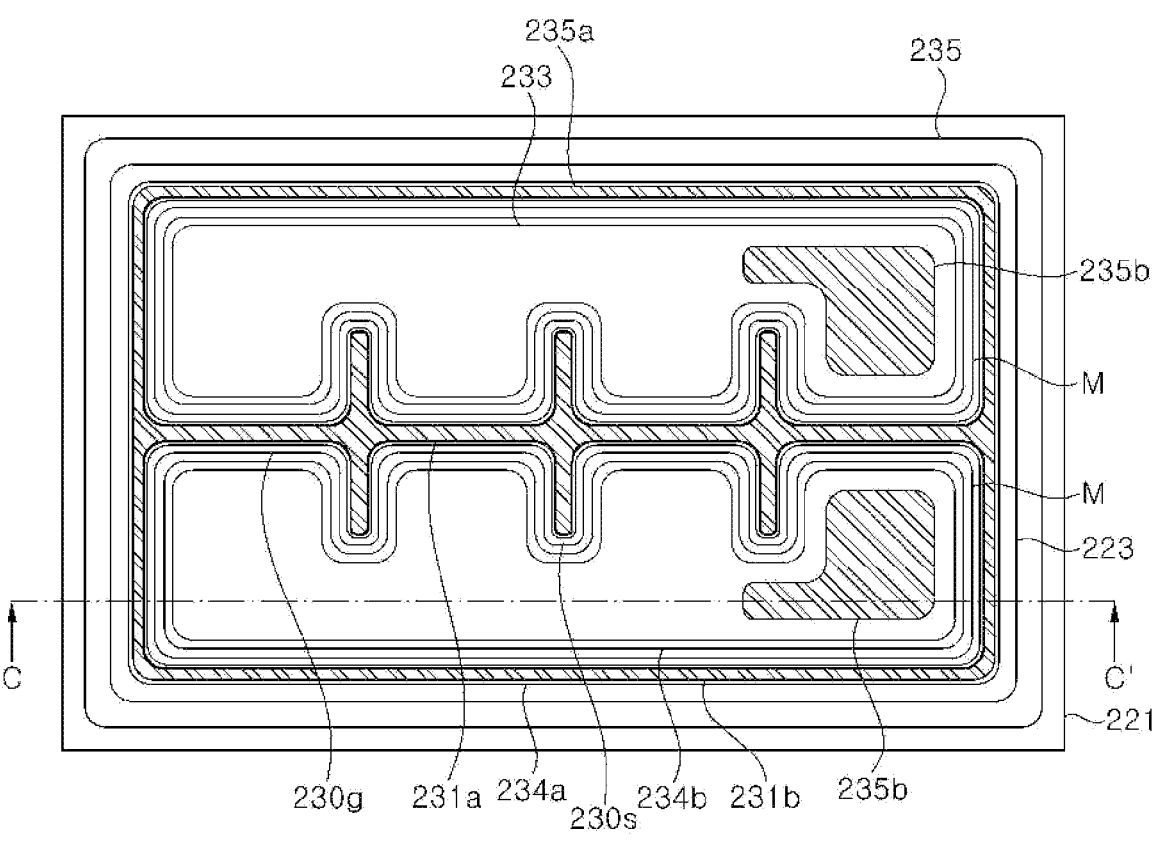
Figure 29B:
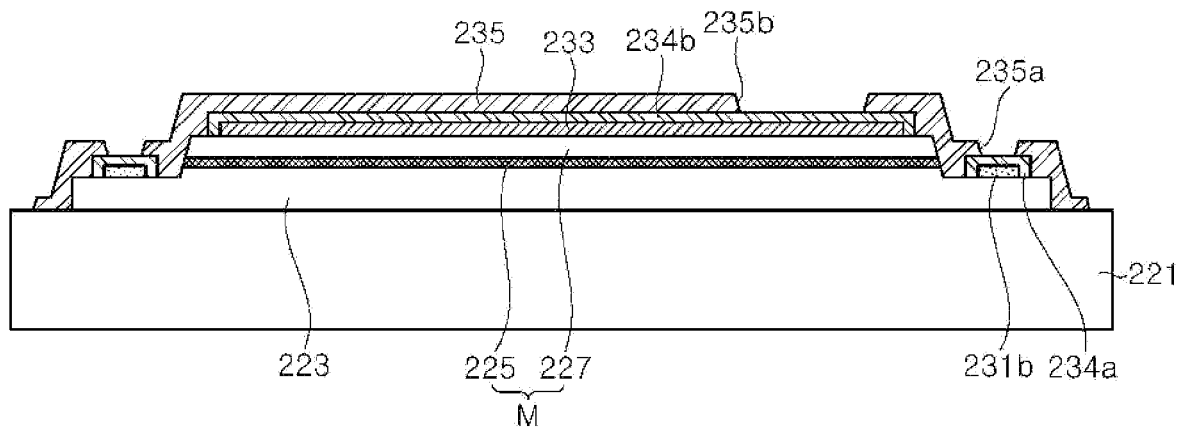

Referring to FIGS. 29A and 29B, a lower insulation layer 235 covering the mesa M is formed. The lower insulation layer 235 covers side surfaces and an upper surface of the mesa M. The lower insulation layer 235 also covers the n-capping layer 234a and the p-capping layer 234b. The lower insulation layer 235 may cover a side surface of the n-type semiconductor layer 223, and may partially cover the substrate 221 exposed around the n-type semiconductor layer 223. Meanwhile, the lower insulation layer 235 has openings 235a and 235b exposing the n-capping layer 234a and the p-capping layer 234b, respectively.

The opening 235a of the lower insulation layer 235 exposes the n-capping layer 234a, and the opening 235b exposes the p-capping layer 234b. The opening 235a may be disposed in the main groove 230g and the sub grooves 230s. In addition, a plurality of openings 235b may be formed on the p-capping layer 234b. As shown in the drawings, the openings 235b may be symmetrically disposed on both sides of the groove 130g.

Figure 30A:
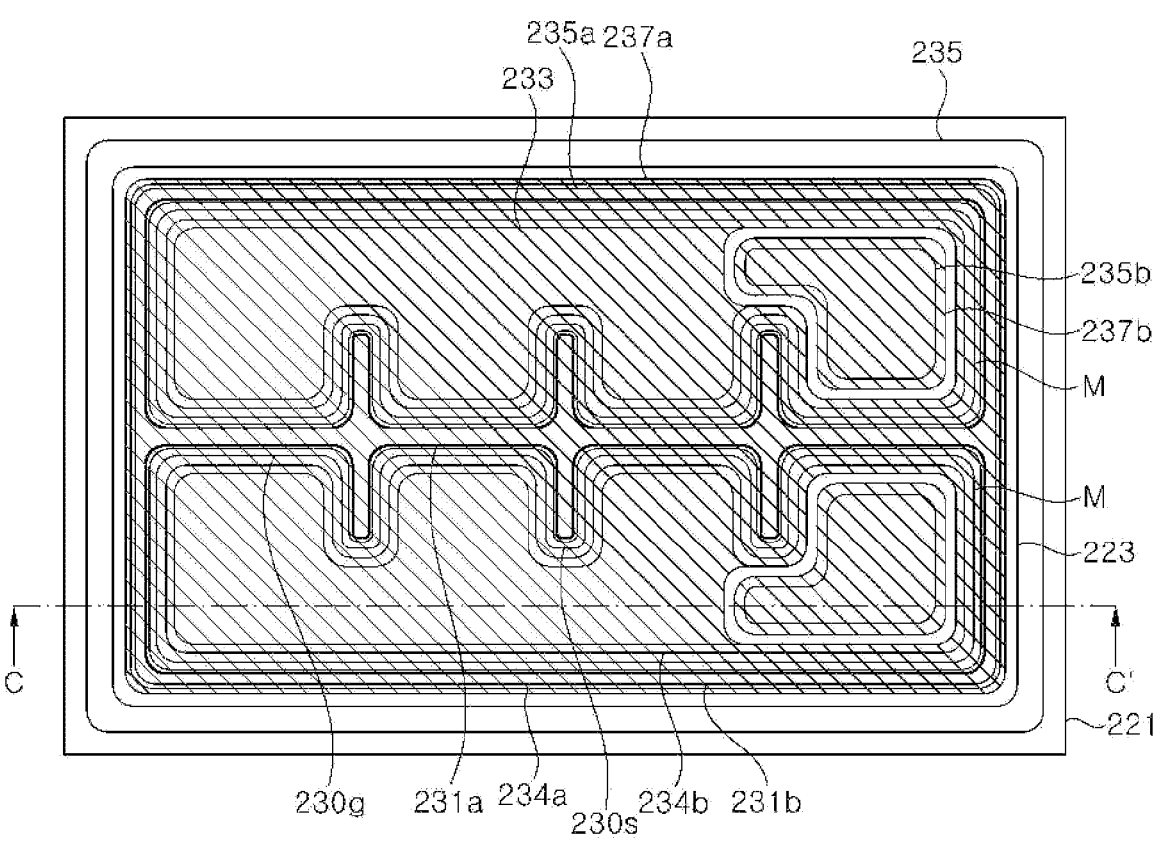
Figure 30B:
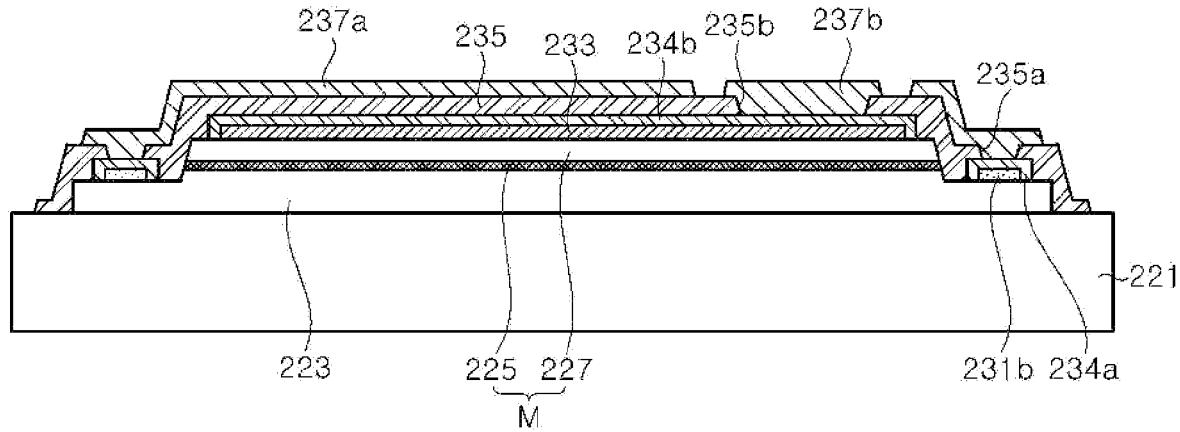

Referring to FIGS. 30A and 30B, an n-pad metal layer 237a and a p-pad metal layer 237b are formed on the lower insulation layer 235. The n-pad metal layer 237a may be electrically connected to the n-capping layer 234a through the opening 235a, and the p-pad metal layer 237b may be electrically connected to the p-capping layer 234b through the opening 235b. As shown in the drawings, the n-pad metal layer 237a may surround the p-pad metal layers 237b.

The n-pad metal layer 237a may cover the opening 235a, and the p-pad metal layer 237b may cover the opening 235b. In addition, the n-pad metal layer 237a may continuously cover the side surfaces of the mesa M, and thus, light reflectivity may be improved on the side surfaces of the mesa M.

Figure 31A:
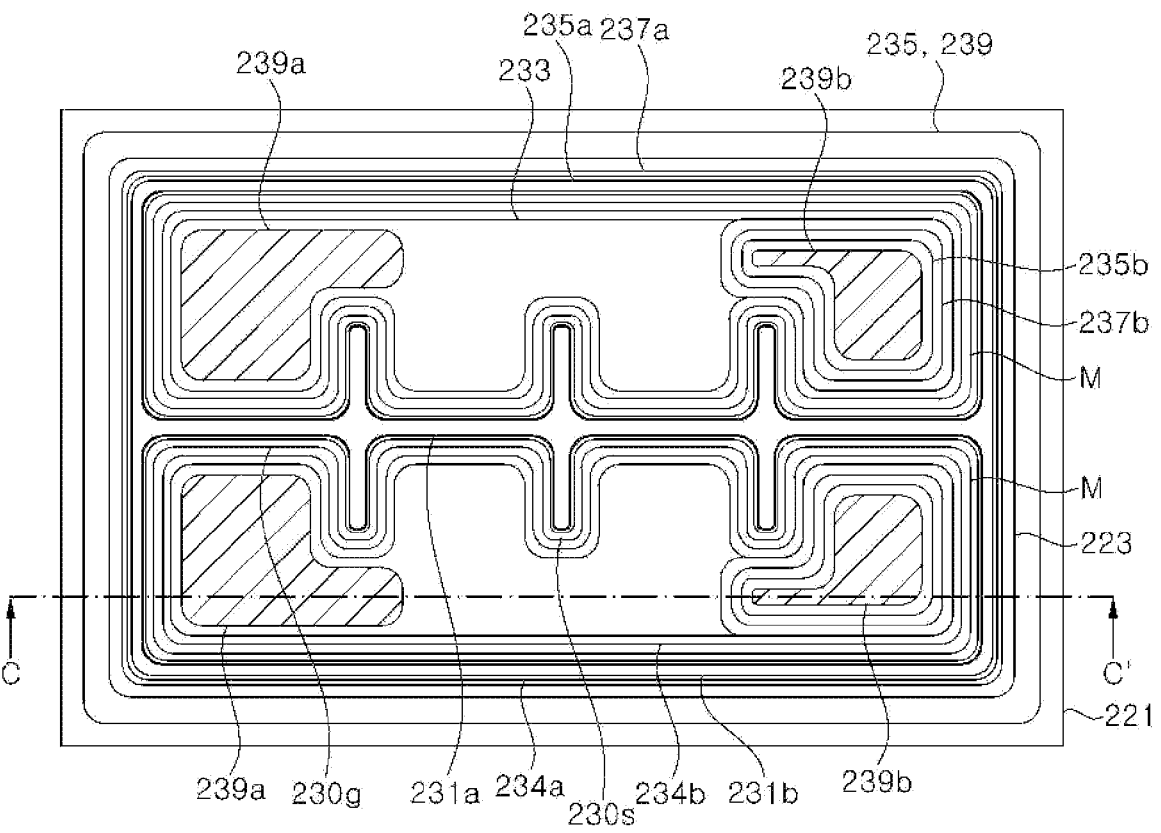
Figure 31B:
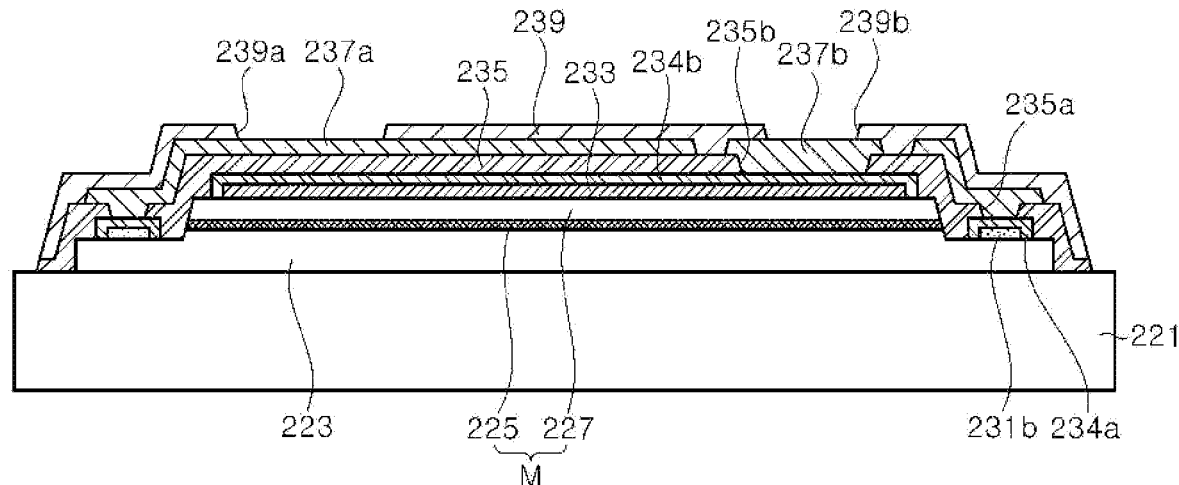

Referring to FIGS. 31A and 31B, an upper insulation layer 239 is formed on the n-pad metal layer 237a and the p-pad metal layer 237b. The upper insulation layer 239 may cover the n-pad metal layer 237a and the p-pad metal layer 237b and also cover an edge of the n-type semiconductor layer 223. The upper insulation layer 239 may also cover a portion of the upper surface of the substrate 221.

The upper insulation layer 239 has openings 239a and 239b exposing the n-pad metal layer 237a and the p-pad metal layer 237b, respectively. The openings 239a expose the n-pad metal layer 237a, and the openings 239b expose the p-pad metal layer 237b. The openings 239a may be formed near the one edge of the mesa M, and the openings 239b may be formed near the opposite edge of the mesa M to face the openings 239a. The openings 239a and 239b of the upper insulation layer 239 may have a shape modified from a rectangle so as to accommodate the sub grooves 230s. That is, as shown in FIG. 31A, the openings 239a and 239b may have a rectangular shape in which a portion thereof is recessed.

Subsequently, as shown in FIGS. 23A and 23B, n-bumps 241a and p-bumps 241b are formed on the upper insulation layer 239. The n-bump 241a is electrically connected to the n-pad metal layer 237a through the openings 239a, and the p-bump 241b is electrically connected to the p-pad metal layer 237b through the openings 239b.

Each of the n-bump 241a and p-bump 241b may partially cover the side surface of the mesa M, but may also be formed to be limited in a region over the mesa M.

According to the illustrated exemplary embodiment, by forming the main groove 230g and the sub grooves 230s within a mesa M region and forming the n-ohmic contact layers 231a and 231b around the mesa M and within the main groove 230g and the sub grooves 230s, current may be uniformly spread over an entire region of the mesa M.

Figure 32:
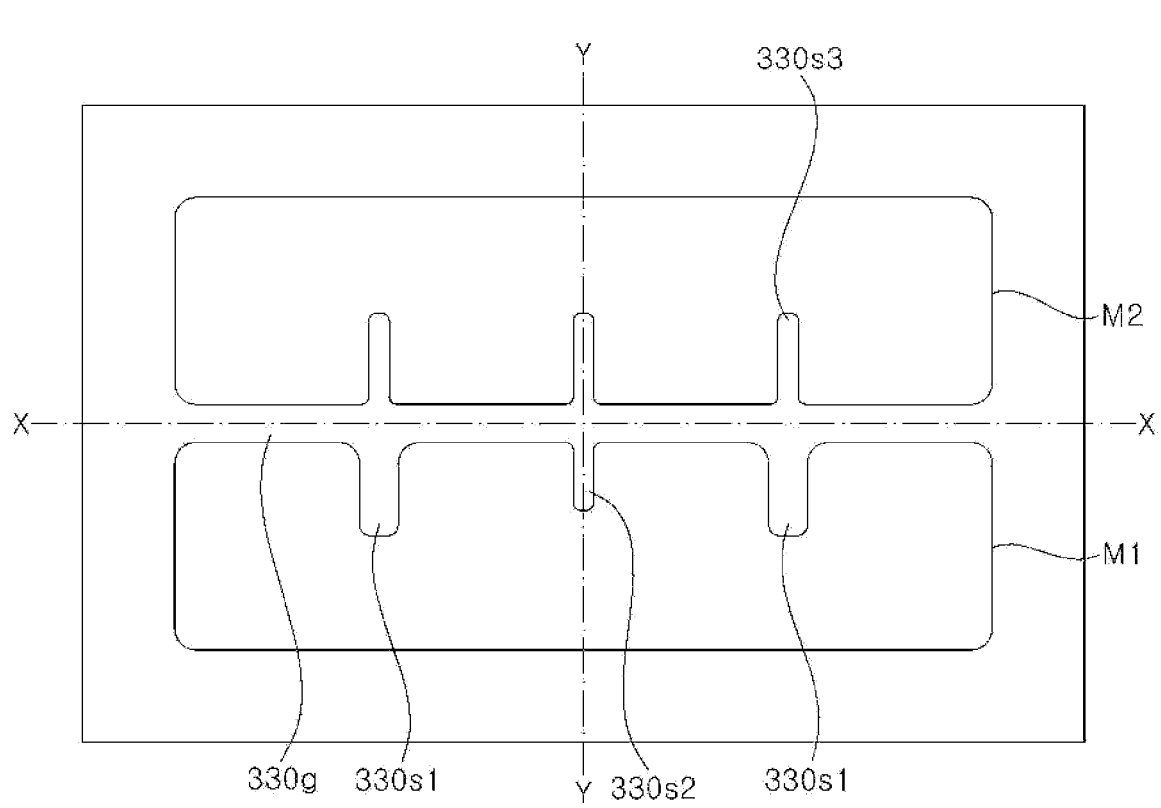
FIG. 32 is a schematic plan view illustrating a modified example of a mesa of a UV light emitting diode according to an exemplary embodiment of the present disclosure.

FIG. 32 is a schematic plan view illustrating a modified example of a mesa of a UV light emitting diode according to an exemplary embodiment of the present disclosure.

In the mesa M of the UV light emitting diode described above with reference to FIGS. 23A and 23B, the sub grooves 230s are symmetrically disposed with respect to the main groove 230g. Lengths and widths of the sub grooves 230s are substantially equal to one another, and thus, the n-ohmic contact layer 231a having a same size is formed in each of the sub grooves 230s. However, the inventive concepts are not limited thereto, and the sub grooves may be variously modified. For example, as shown in FIG. 32, sub-symmetrical mesa regions M1 and M2 may be formed with respect to a line X-X passing through a center of the light emitting diode and parallel to a main groove 330g. That is, sub grooves 330s, 330s2, and 330s3 are asymmetrically disposed with respect to the line X-X. Meanwhile, the sub grooves 330s1, 330s2, and 330s3 may be symmetrically disposed with respect to a line Y-Y passing through the center of the light emitting diode and perpendicular to the main groove 330g.

The sub grooves 330s1, 330s2, and 330s3 may be disposed on both sides of the main groove 330s, but the sub grooves 330s, 330s2, and 330s3 may have different widths and/or lengths. For example, the sub groove 330s2 having a relatively small width and length may be disposed between the sub grooves 330s1 having a relatively large width and length. In addition, the sub grooves 330s1 and 330s3 having different widths and/or lengths may be disposed opposite each other with the main groove 330g interposed therebetween. By increasing the width of the sub groove 330s1, light reflection generated from a mesa sidewall may be increased.

The inventive concepts are not limited to the main groove 330g and the sub grooves 330s1, 330s2, and 330s3 described herein, and may be variously modified.

Although some exemplary embodiments have been described herein, it should be understood that the above exemplary embodiments may be variously modified and changed without departing from the spirit and scope of the present disclosure, and the present disclosure includes all of the broad scope of the appended claims.

The invention claimed is:

1. A deep UV light emitting diode, comprising:
a substrate;
an n-type semiconductor layer disposed on the substrate;
a mesa disposed on the n-type semiconductor layer, including an active layer and a p-type semiconductor layer, and including a groove exposing the n-type semiconductor layer;
n-ohmic contact layers contacting the n-type semiconductor layer in the groove;
a p-ohmic contact layer contacting the p-type semiconductor layer;
an n-pad metal layer electrically connected to the n-ohmic contact layers;
a p-pad metal layer electrically connected to the p-ohmic contact layer;
an n-bump electrically connected to the n-pad metal layer; and
a p-bump electrically connected to the p-pad metal layer, wherein:
the groove extends in a longitudinal direction of the mesa,
a difference between a length of the mesa in the longitudinal direction and a length of the groove is smaller than or equal to a width of each mesa region disposed on both sides of the groove.

2. The deep UV light emitting diode of claim 1, further comprising:
an n-capping layer covering the n-ohmic contact layers; and
a p-capping layer covering the p-ohmic contact layer.

3. The deep UV light emitting diode of claim 1, wherein a total area of the mesa region disposed on both sides of the groove exceeds ½ of a total area of the mesa.

4. The deep UV light emitting diode of claim 1, wherein corners of one end of the mesa region disposed on both sides of the groove have a curved shape.

5. The deep UV light emitting diode of claim 1, wherein depressions are formed at outer corners among the corners of one end of the mesa region disposed on both sides of the groove, respectively.

6. The deep UV light emitting diode of claim 1, wherein the groove includes a main groove extending in the longitudinal direction of the mesa; and
a plurality of sub grooves extending in a direction perpendicular to the main groove.

7. The deep UV light emitting diode of claim 6, wherein the plurality of sub-grooves includes grooves having different lengths and widths.

8. The deep UV light emitting diode of claim 6, wherein the deep UV light emitting diode has a symmetric structure with respect to a line passing through a center and parallel to the sub-groove.

9. The deep UV light emitting diode of claim 6, wherein the deep UV light emitting diode has an asymmetric structure with respect to the line passing through the center and parallel to the main groove.

\* \* \* \* \*